United States Patent [19]
Hamada

[11] Patent Number: 5,888,856
[45] Date of Patent: Mar. 30, 1999

[54] METHOD OF FABRICATING A TOP-GATE TYPE THIN FILM TRANSISTOR WITH DANGLING BONDS OF SILICON PARTLY COMBINED WITH HYDROGEN

[75] Inventor: Koji Hamada, Tokyo, Japan

[73] Assignee: NEC Corporation, Tokyo, Japan

[21] Appl. No.: 636,755

[22] Filed: Apr. 19, 1996

Related U.S. Application Data

[62] Division of Ser. No. 561,334, Nov. 21, 1995, Pat. No. 5,693,961.

[30] Foreign Application Priority Data

Nov. 22, 1994 [JP] Japan ................................ 6-287737

[51] Int. Cl.⁶ .................................................. H01L 21/336
[52] U.S. Cl. ........................................ 438/162; 438/475
[58] Field of Search .................................. 438/162, 475, 438/155, 448, 151

[56] References Cited

U.S. PATENT DOCUMENTS

| | | | |
|---|---|---|---|
| 5,250,444 | 10/1993 | Khan et al. | 438/162 |
| 5,470,763 | 11/1995 | Hamada . | |
| 5,534,445 | 7/1996 | Tran et al. | 438/162 |
| 5,541,119 | 7/1996 | Kodama | 438/162 |

FOREIGN PATENT DOCUMENTS

| | | |
|---|---|---|
| A59-2352 | 1/1984 | Japan . |
| A59-21064 | 2/1984 | Japan . |
| A59-204275 | 11/1984 | Japan . |
| A60-175458 | 9/1985 | Japan . |
| 2-14568 | 1/1990 | Japan .................. 438/448 |
| 2-7420 | 1/1990 | Japan .................. 438/448 |
| A272669 | 3/1990 | Japan . |
| 2-234437 | 9/1990 | Japan .................. 438/448 |
| A5218430 | 8/1993 | Japan . |
| A5243273 | 9/1993 | Japan . |
| A8124872 | 5/1996 | Japan . |

OTHER PUBLICATIONS

I–Wei Wu, et al., "Effects of Trap–State Density Reduction by Plasma Hydrogenation in Low–Temperature Polysilicon TFT", *IEEE Electron Device Letters,* vol. 10, No. 3, Mar. 1989, pp. 123–125.

I–Wei Wu, et al., "Performance of Polysilicon TFT Digital Circuits Fabricated with Various Processing Techniques and Device Architectures", *SID 90 Digest,* 1990, pp. 307–310 no month.

*Primary Examiner*—Mary Wilczewski
*Attorney, Agent, or Firm*—Sughrue, Mion, Zinn, Macpeak & Seas, PLLC

[57] ABSTRACT

In a top-gate type thin film transistor including a polycrystalline silicon pattern having a channel region, a source region and a drain region on a substrate, a gate electrode via a gate insulating layer on the polycrystalline silicon layer, an insulating layer thereon, and metal electrodes coupled to the source region and the drain region, dangling bonds of silicon of the channel region at an interface with the gate insulating layer and dangling bonds of silicon of a part of the drain region are combined with hydrogen.

20 Claims, 27 Drawing Sheets

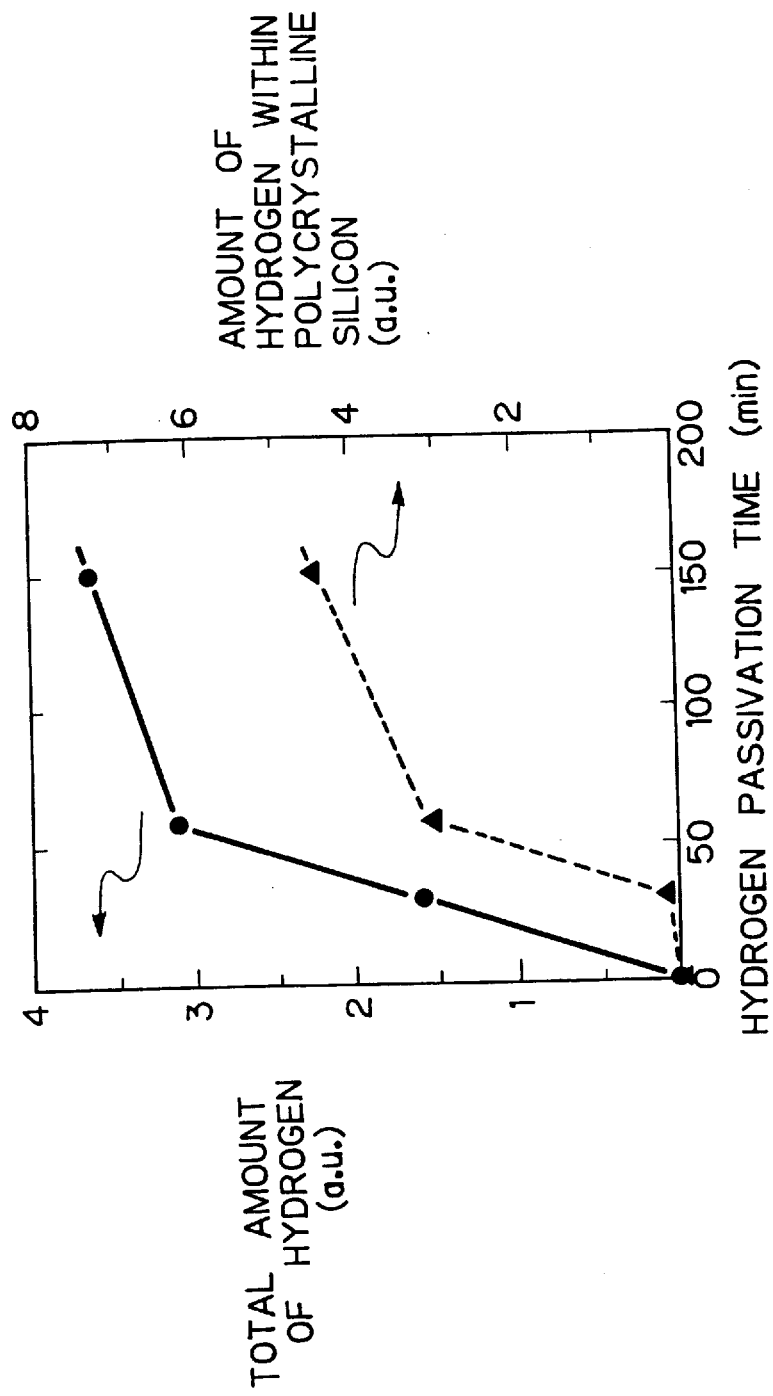

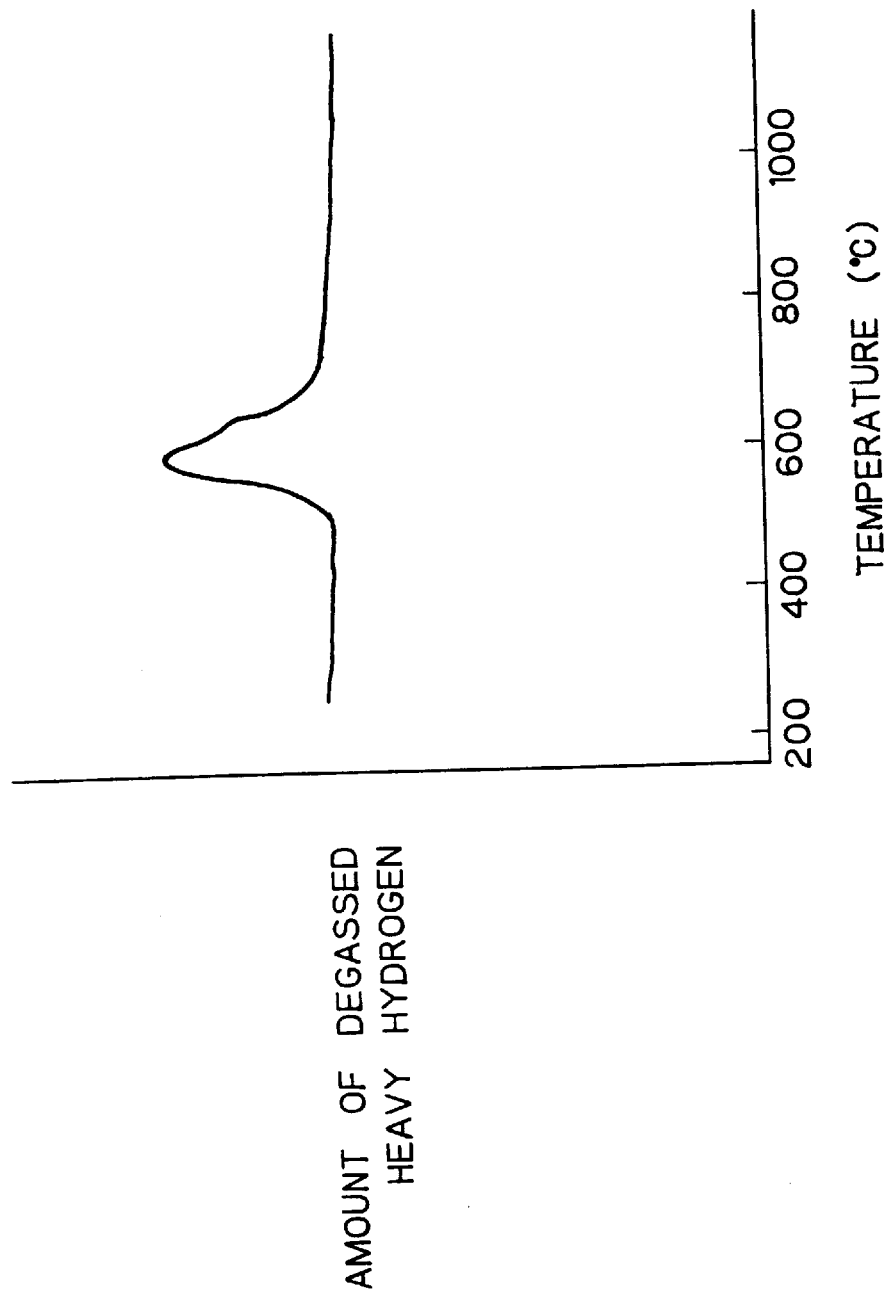

5,888,856

METHOD OF FABRICATING A TOP-GATE TYPE THIN FILM TRANSISTOR WITH DANGLING BONDS OF SILICON PARTLY COMBINED WITH HYDROGEN

This is a divisional of application Ser. No. 08/561,334 filed Nov. 21, 1995, now U.S. Pat. No. 5,693,961.

BACKGROUND OF THE INVENTION

1. Field of the Invention

The present invention relates to a top-gate type polycrystalline silicon thin film transistor (TFT).

2. Description of the Related Art

Polycrystalline silicon TFT's are used in integrated circuits, particularly, load elements of a static random access memory (SREM) and liquid crystal devices (LCD's).

In a prior art method for manufacturing a top-gate type TFT, a polycrystalline silicon layer, a gate insulating layer, a gate electrode layer, a non-doped insulating layer, and a metal connection layer are formed on a substrate, and then, a hydrogen passivation using hydrogenation by plasma discharge is carried out, to thereby reduce trap state densities of the polycrystalline silicon layer and improve the performance of the TFT. That is, a hydrogen passivation time is so long that saturated trap reduction characteristics and saturated threshold voltage characteristics can be obtained (see: I-WEI WU et al. "Effect of Trap-State Density Reduction by Plasma Hydrogeneration in Low-Temperature Polysilicon, TFT", IEEE ELECTRON DEVICE LETTERS, VOL. 10, No. 3, pp. 123–125, March 1989 and "Performance of Polysilicon TfT Digital Circuits Fabricated with Various Processing Techniques and Device Architechtures", SID 90 Digest, pp. 307–310, 1990). This will be explained later in detail.

In the above-described prior art method, when a gate length of the TFT is too small, for example, less than 10 $\mu$m, a parasitic bipolar phenomenon may occur, so that the electric property is fluctuated. For example, the breakdown voltage of the TFT is reduced, and the threshold voltage of the TFT is fluctuated.

SUMMARY OF THE INVENTION

It is an object of the present invention to provide a top-gate type TFT capable of suppressing the reduction of the breakdown voltage and the fluctuation of the threshold voltage.

Another object is to provide a method for manufacturing such a top-gate type TFT.

According to the present invention, in a top-gate type thin film transistor including a polycrystalline silicon pattern having a channel region, a source region and a drain region on a substrate a gate electrode via a gate insulating layer on the polycrystalline silicon layer, an insulating layer thereon, and metal electrodes coupled to the source region and the drain region, dangling bonds of silicon of the channel region at an interface with the gate insulating layer and dangling bonds of silicon of a part of the drain region are combined with hydrogen.

Thus, in the channel region, since only dangling bonds of silicon at the interface of the channel region and the gate insulating layer are combined with hydrogen, no parasitic bipolar phenomenon occurs.

BRIEF DESCRIPTION OF THE DRAWINGS

The present invention will be more clearly understood from the description as set forth below, in comparison with the prior art, with reference to the accompanying drawings, wherein:

FIG. 8 is a graph showing hydrogen peak intensity characteristics for estimating the amount of hydrogen trapped in the polycrystalline silicon pattern of FIGS. 4J and 5;

FIG. 10 is a graph showing degassed heavy hydrogen characteristics of the device of FIG. 4B;

DESCRIPTION OF THE PREFERRED EMBODIMENTS

Before the description of the preferred embodiments, a prior art method for manufacturing a TFT will now be explained with reference to FIG. 1 (see: the above-mentioned documents by I-WEI WU et al.).

Figure 1:
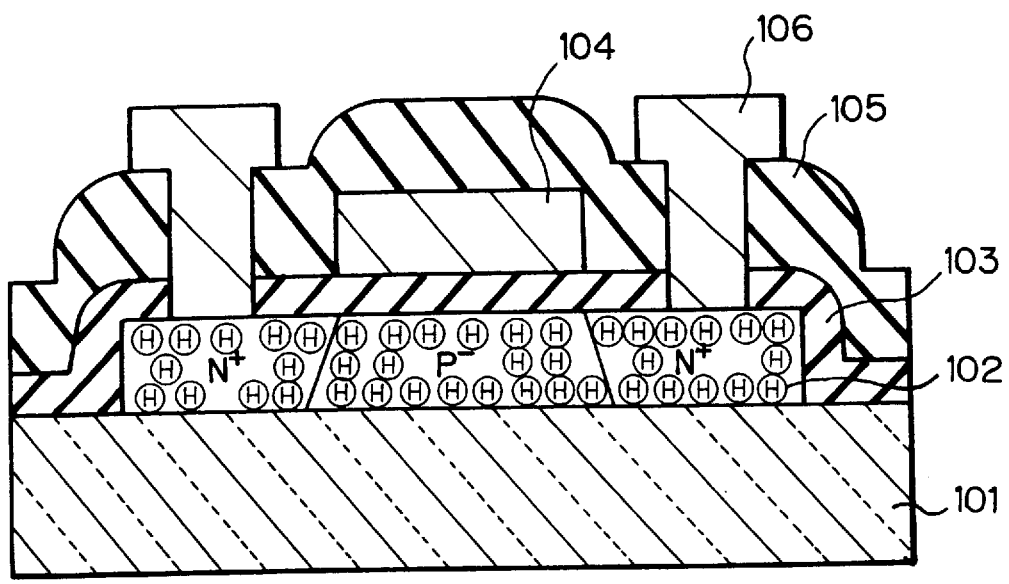
FIG. 1 is a cross-sectional diagram illustrating a prior art top-gate type TFT.

In FIG. 1, a prior art top-gate type TFT is illustrated. That is, a 100 nm thick amorphous silicon is deposited on a fused quartz substrate 101 by a low pressure chemical vapor deposition (LPCVD) process, and a heating operation is performed thereupon at a temperature of 600° C. for four hours in a nitrogen atmosphere, to thereby from a polycrystalline silicon layer 102. The polycrystalline silicon layer 102 is patterned into an island. Then, a 100 nm thick gate silicon oxide layer 103 is formed, and also, a 350 nm thick polycrystalline silicon gate electrode layer 104 is formed. After the gate electrode layer 104 is patterned, 2×10$^{15}$ phosphorous ions/cm$^2$ are doped in self-alignment with the patterned gate electrode layer 104, to form N$^+$-type source and drain regions in the polycrystalline silicon layer 102. Then, a 700 nm thick non-doped low temperature silicon oxide (LTO) layer 105 is deposited by a LPCVD process, and a heating operation at 600° C. is carried out to anneal the doped impurity ions within the source and drain regions of the polycrystalline silicon layer 102. Thereafter, contact holes are perforated within the LTO layer 105 and the gate silicon oxide layer 103, and a 1 μm thick AlSiCu layer 106 is deposited. Then, the device of FIG. 1 is sintered at a temperature of 450° C. for 30 minutes within a $H_2$—$N_2$ forming gas. Finally, a hydrogen passivation is carried out for 16 hours in a parallel-plate plasma reactor at a substrate temperature of 350° C. with an $H_2$ and Ar gas mixture at a power density of 0.21 W/cm² and a frequency of 30 kHz. As a result, dangling bonds of silicon of the polycrystalline silicon layer 102 are completely combined with hydrogen. Thus, the TFT is completed.

Figure 2:
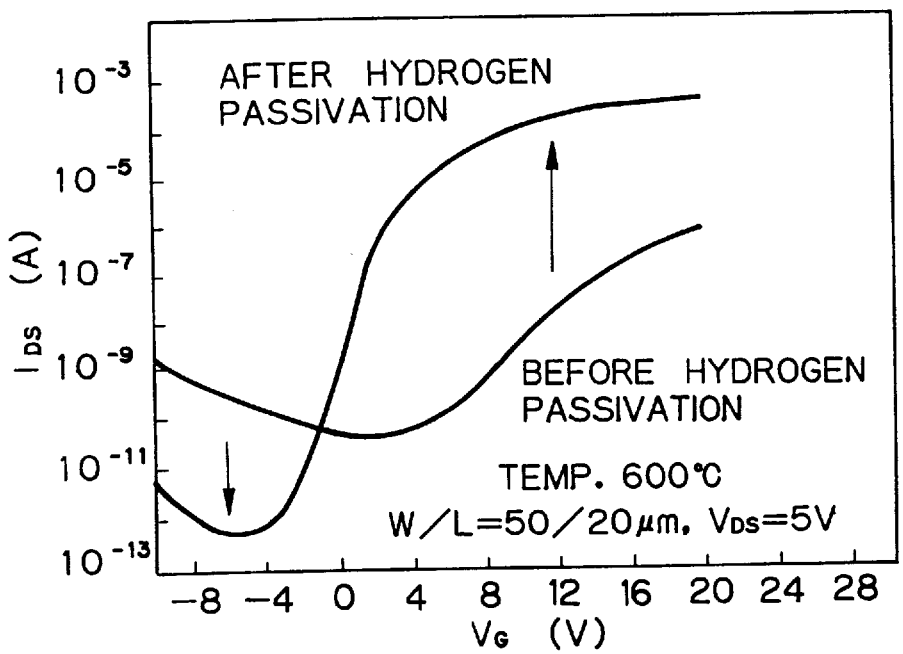
FIG. 2 is a graph showing $I_{DS}$-$V_G$ characteristics of the TFT of FIG. 1.

In the TFT of FIG. 1, hydrogen atoms can diffuse in the 700 nm thick non-doped LTO layer 105 to reach the active channel region of the polycrystalline silicon layer 102. Therefore, as shown in FIG. 2, when a gate length L is 50 μm, a gate width W is 20 μm, and a drain voltage $V_{DS}$ is 5 V, the drain current ($I_{DS}$)-to-gate voltage ($V_G$) characteristics are improved. That is, a leakage current is decreased some hundred times ($\approx 10^{-2}$), an ON current is increased some thousand times ($\approx 10^{-3}$) at the gate voltage $V_G=20$ V and some hundreds of thousands of times $\approx 10^5$) at the gate voltage $V_{G=}5$ V. Also a subthreshold voltage characteristic is improved.

Figure 3:
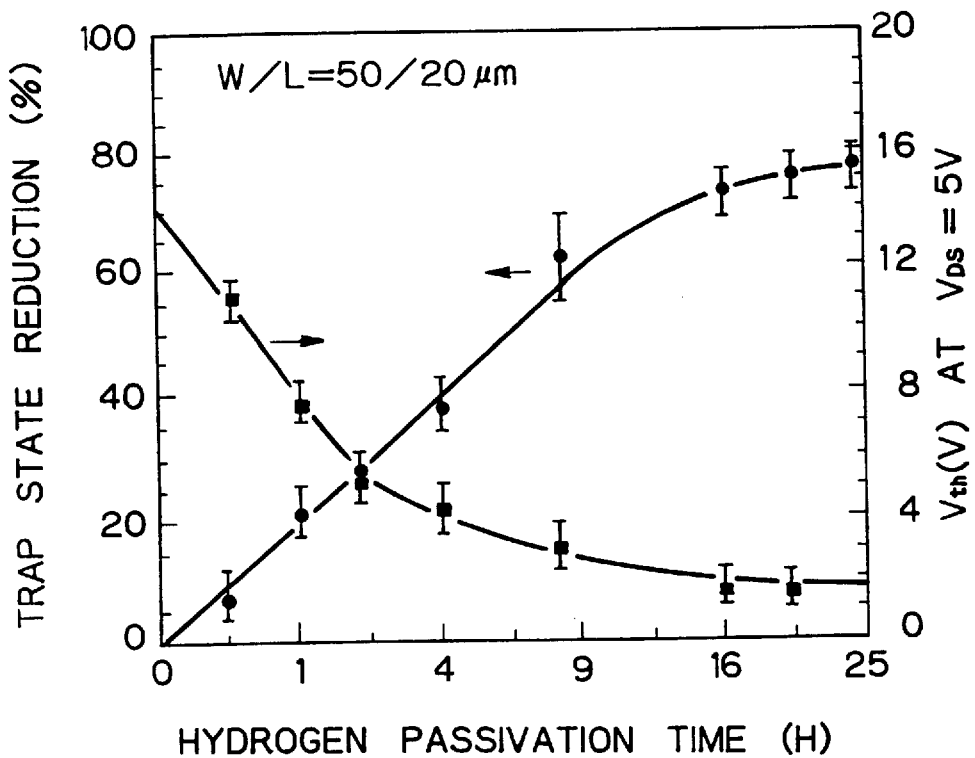
FIG. 3 is a graph showing trap state reduction characteristics and threshold voltage characteristics of the TFT of FIG. 1 dependent upon a hydrogen passivation time period.

Also, as shown in FIG. 3, which shows the trap state reduction and threshold voltage characteristics of the polycrystalline silicon layer 102, when the hydrogen passivation time is longer than 16 hours, saturated trap state reduction characteristics and saturated threshold voltage characteristics are obtained.

The TFT of FIG. 1 can be applied to a case where the gate length L is relatively large, such as, L=50 μm. However, when the gate length L becomes small, for example, when L=10 μm, the electric property of the TFT is fluctuated.

That is, the P⁻-type channel region of the polycrystalline silicon layer 102 is in a floating state, and accordingly, the voltage $V_{BODY}$ at the channel region is dependent upon the drain voltage $V_{DS}$. Also, when the voltage $V_{BODY}$ at the channel region reaches 0.6 V, a parasitic bipolar phenomenon may occur to thereby fluctuate the electrical property of the TFT. Therefore, the drain voltage $V_{DS}$ is required to be sufficiently high, by which the voltage $V_{BODY}$ at the channel region reaches 0.6 V.

However, the insulating layer 105 is made of a double structure of non-doped silicon oxide and flattened boron-including phospho-silicated glass (BPSG) and the gate length L is smaller than 10 μm. Therefore when a hydrogen passivation is carried out for 16 hours, the drain voltage is smaller than 6 V when the voltage $V_{BODY}$ at the channel region reaches 0.6 V. As a result, the breakdown voltage is reduced, and the threshold voltage is fluctuated. In view of the requirement for a ±20 percent fluctuation of the power supply voltage, the prior art TFT of FIG. 1 cannot be applied to 5 V system devices.

FIGS. 4A through 4J are cross-sectional views illustrating a first embodiment of the method for manufacturing a top-gate TFT according to the present invention.

Figure 4A:
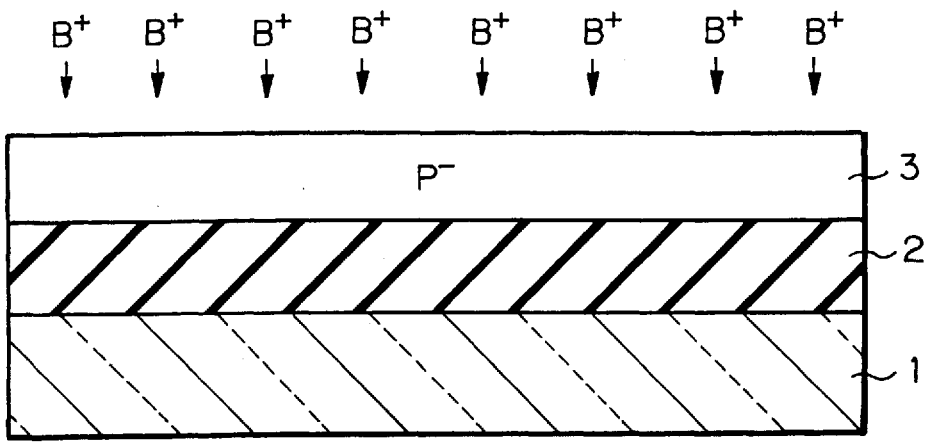
FIG. 4A through 4J are cross-sectional views illustrating a first embodiment of the method for manufacturing a top-gate type TFT according to the present invention.

First, referring to FIG. 4A, a non-doped silicon oxide layer 2 is deposited on a fused quartz substrate 1 by a CVD process. In this case, other insulating layers made of silicon nitride or a stacked configuration of non-doped silicon oxide and BPSG can be used instead of the non-doped oxide layer 2. Also, if a monocrystalline silicon substrate is used instead of the fused quartz substrate 1, the non-doped silicon oxide layer 2 is grown by thermally oxidizing the monocrystalline silicon substrate.

Then, an about 80 nm thick amorphous silicon layer is deposited by an LPCVD process at a substrate temperature of about 500° C. with a source gas of $Si_2H_6$. Then, the amorphous silicon is heated for about 12 hours at a temperature of about 600° C. in a nitrogen atmosphere to change the amorphous silicon into a polycrystalline silicon layer 3. In this case, before or after the conversion of the amorphous silicon into the polycrystalline silicon layer 3, about $2 \times 10^{17}$ boron ions per cm² are implanted thereinto, so that the polycrystalline silicon layer 3 is of a P⁻-type.

Figure 4B:
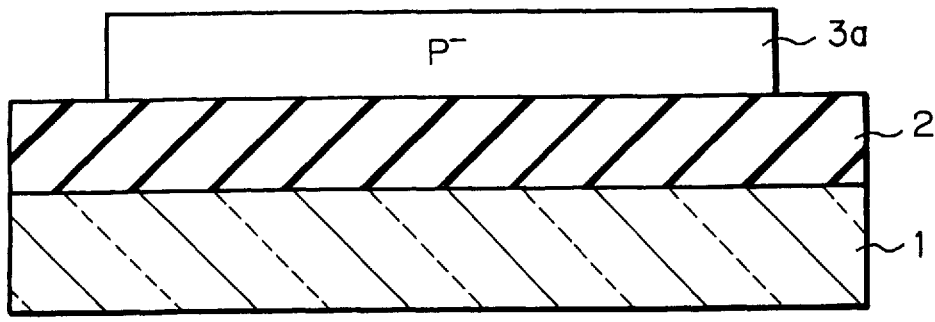

Next, referring to FIG. 4B, the polycrystalline silicon layer 3 is patterned into an island-shaped polycrystalline silicon pattern 3a.

Figure 4C:
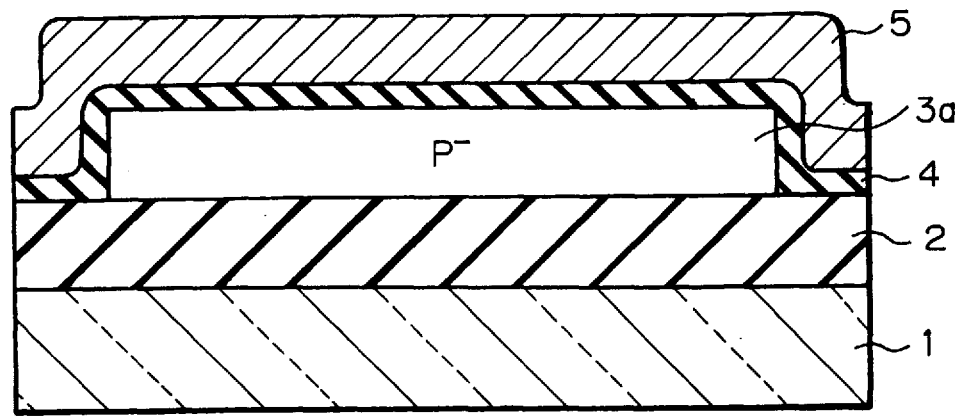

Next, referring to FIG. 4C, an about 100 nm thick non-doped gate silicon oxide layer 4 is formed by an LPCVD process. Then, an about 200 nm thick polycrystalline silicon layer 5 is formed by an LPCVD process.

Figure 4D:
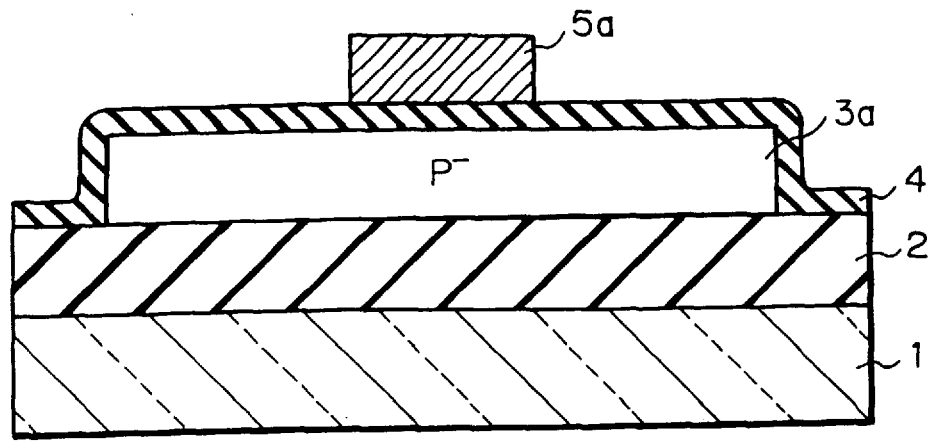

Next, referring to FIG. 4D, the polycrystalline silicon layer 5 is patterned into a gate electrode layer 5a.

Note that the gate electrode layer 5a can be made of polycide, silicide or metal.

Figure 4E:
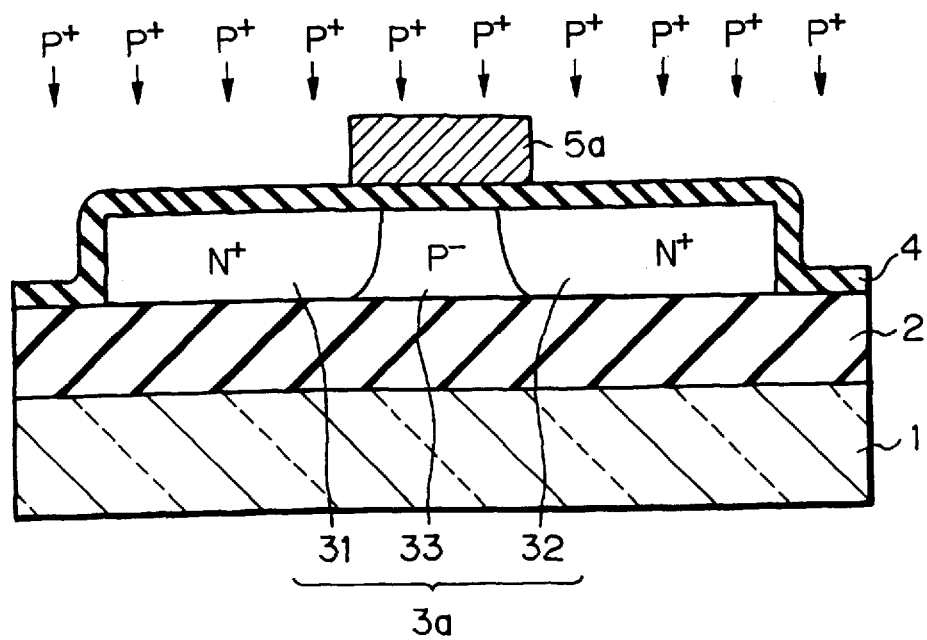

Next, referring to FIG. 4E, about $1 \times 10^{15}$ phosphorous ions/cm² are implanted at an energy of about 50 keV into the polycrystalline silicon pattern 3a in self-alignment with the gate electrode layer 5a. As a result, an N⁻-type source 31 and an N⁺-type drain region 32 are formed in self-alignment with the gate electrode layer within the polycrystalline silicon pattern 3a. Also, simultaneously, a P⁻-type channel region 33 is formed within the polycrystalline silicon pattern 3a between the N⁺-type source region 31 and the N⁺-type drain region 32.

Figure 4F:
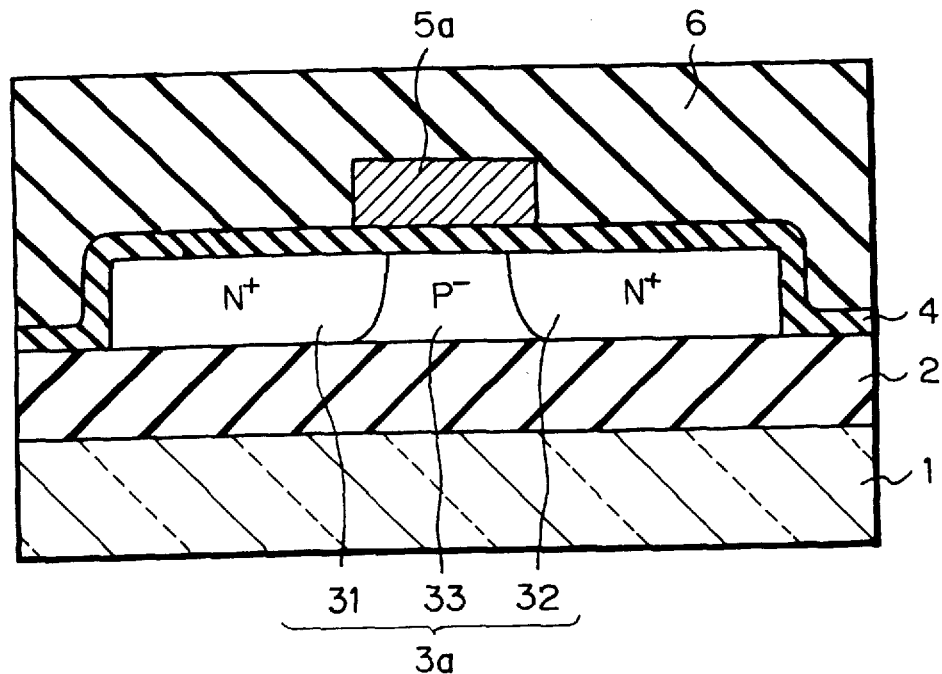

Next, referring to FIG. 4F, an about 50 nm thick non-doped silicon oxide layer is formed by an LPCVD process, and then, an about 350 nm thick BPSG layer is formed by an atmospheric pressure CVD (APCVD) process. Thus, an insulating layer 6 made of silicon oxide and BPSG is formed. Then, a heating operation is carried out at about 900° C. for about 30 minutes to anneal the source region 31 and the drain region 32 and flatten the insulating layer 6. In this case, the non-doped silicon oxide of the insulating layer 6 protects the active region of the TFT, i.e., the polycrystalline silicon pattern 3a. Also, since the BPSG of the insulating layer 6 includes impurities such as boron and phosphorous, the non-doped silicon oxide of the insulating layer 6 prevents such impurities from being diffused into the polycrystalline silicon pattern 3a.

Note that phospho-silicated glass (PSG) layer, boron-silicated glass (BSG) or a stacked configuration thereof can be used instead of the BPSG of the insulating layer 6. However, silicon nitride is never used for the insulating layer 6, since the silicon nitride prevents hydrogen from being diffused into the polycrystalline silicon pattern 3a.

Also, if the source region 31 and the drain region 32 are of a lightly-doped drain (LDD) structure or the source region 31 and the drain region 32 are shifted slightly from the gate electrode 5a, the gate silicon oxide layer 4 is removed from the source region 31 and the drain region 32. Therefore, in this case, the non-doped silicon oxide of the insulating layer 6 is required to cover the source region 31 and the drain region 32 again.

Figure 4G:
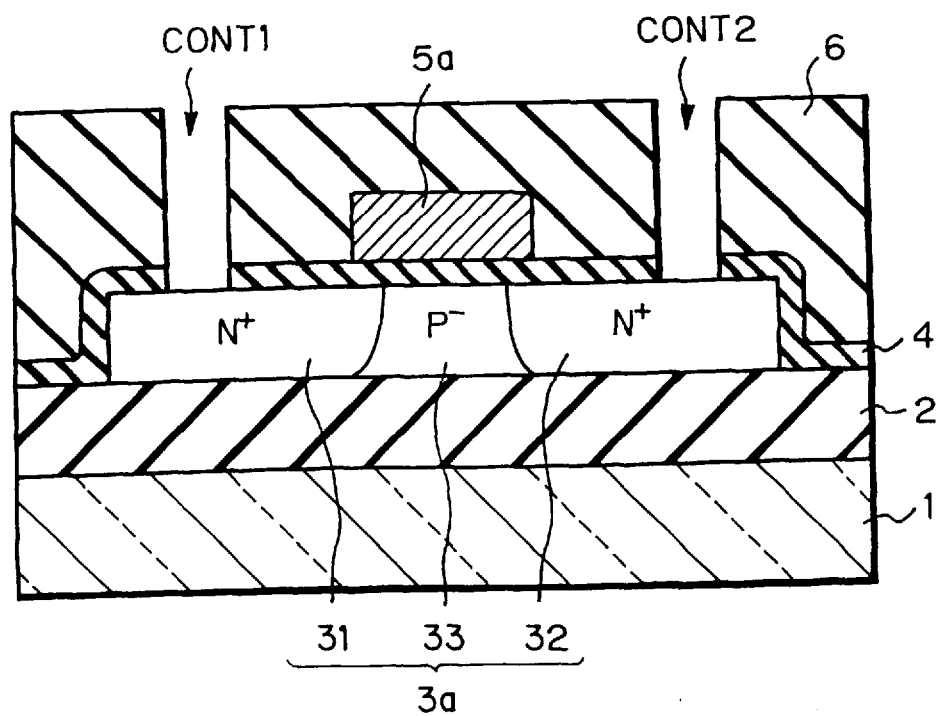

Next, referring to FIG. 4G, contact holes CONT1 and CONT2 are perforated in the insulating layer 6 and the gate silicon oxide layer 4, so that the source region 31 and the drain region 32 are partly exposed.

Figure 4H:
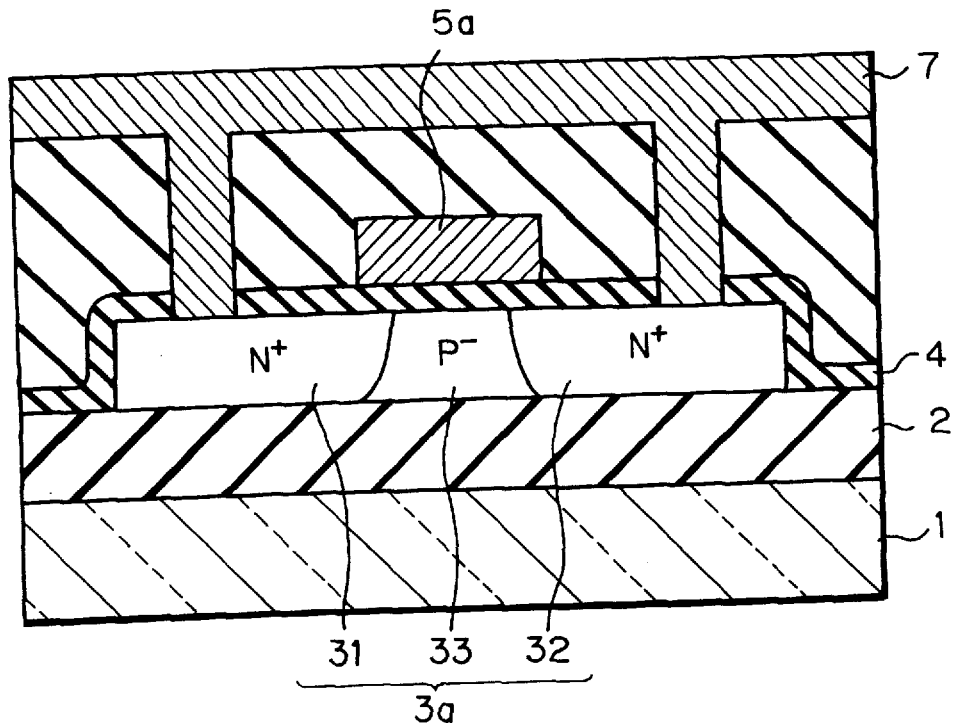

Next, referring to FIG. 4H, an about 1 μm thick Al—Si—Cu alloy layer 7 is deposited by sputtering. Then, the device is sintered at a temperature of about 400° C. for about 20 minutes in a $H_2/N_2$ forming gas. As a result, an ohmic contact is realized between the regions 31 and 32 and the Al—Si—Cu alloy layer 7.

Note that a barrier layer made of TiW, Ti, $TiSi_2$ or TiN can be provided between the regions 31 and 32 and the Al—Si—Cu alloy layer 7. Also, other metal such as AlSi can be used for the layer 7.

Figure 4I:
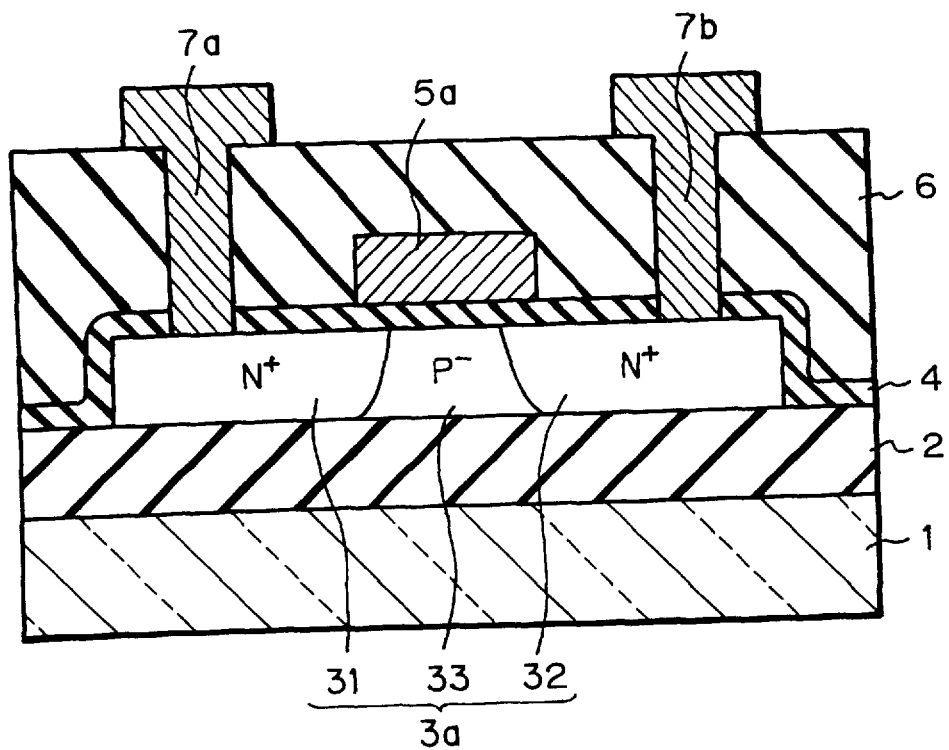
Figure 4:
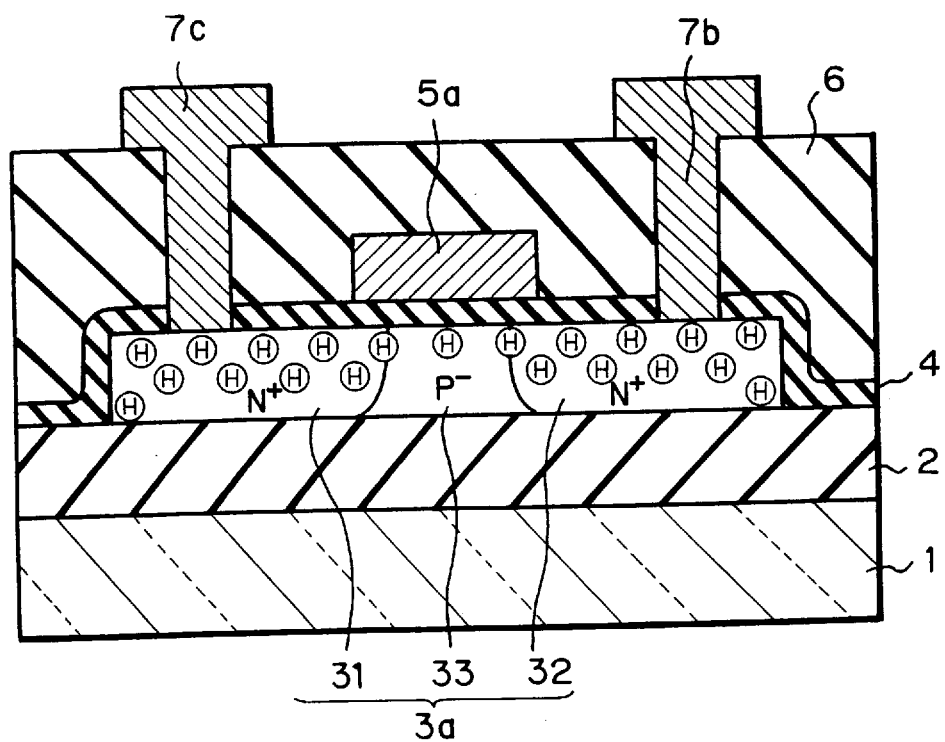

Next, referring to FIG. 4I, the Al—Si—Cu alloy layer 7 is patterned, so that electrode layers 7a and 7b are formed on the source region 31 and the drain region 32, respectively.

Figure 5:
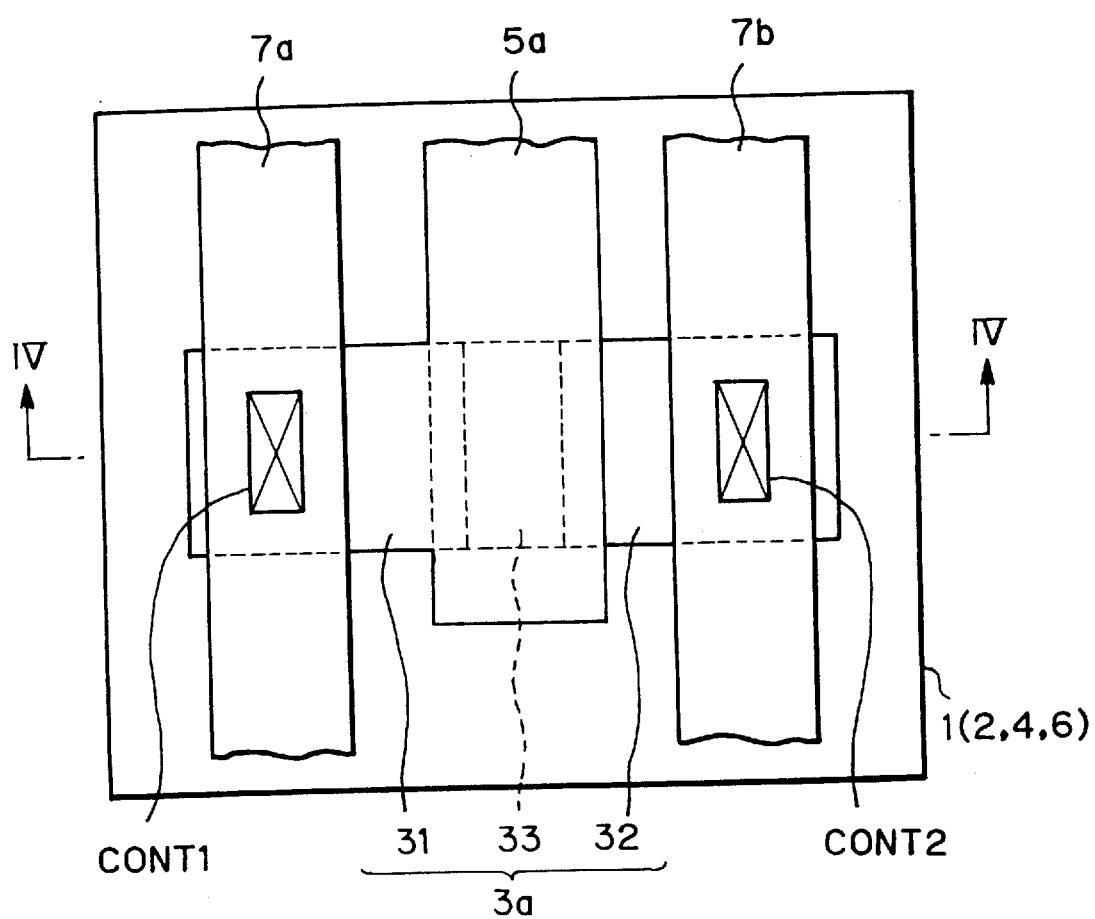
FIG. 5 is a plan view of the TFT of FIG. 4J.

Finally, referring to FIG. 4J, a hydrogen passivation is carried out for about 30 minutes in a parallel-plate plasma reactor at a substrate temperature of about 350° C. with $H_2$—Ar gas at a power density of 0.21 $W/cm^2$ and a frequency of 30 kHz. Note that FIG. 5 is a plan view of the device of FIG. 4J, which is taken along the line IV—IV of FIG. 5.

In FIG. 4J, in the channel region 33, only dangling bonds of silicon at an interface with the gate silicon oxide layer 4 are combined with hydrogen. On the other hand, in the source region 31 and the drain region 32, most of the dangling bonds of silicon therein are combined with hydrogen.

After that as occasion demands, a step for forming a passivation layer is carried out; however, in this case, such a step is carried out at a temperature lower than about 500° C. This will be explained later in detail.

Figure 6:
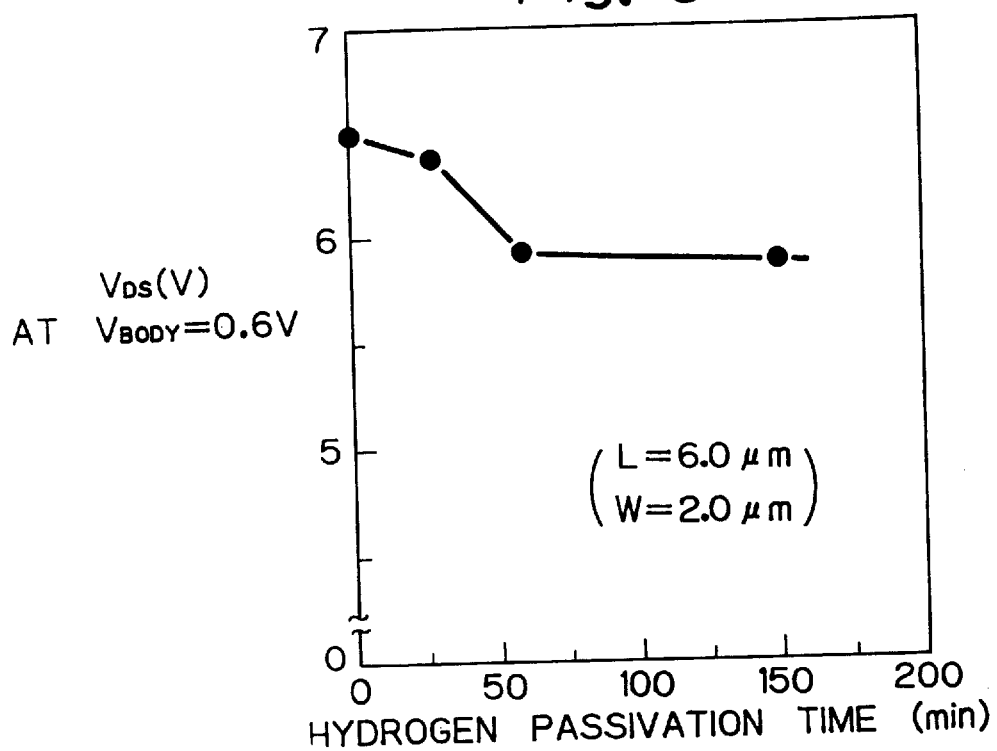
FIG. 6 is a graph showing hydrogen passivation time in relation to drain voltage characteristics of the TFT of FIG. 4J and 5.

In FIG. 6, which shows hydrogen passivation time in relation to drain voltage characteristics where the gate length L is 6.0 $\mu$m and the gate width W is 2.0 $\mu$m, the hydrogen passivation time is changed in the first embodiment. As explained above, a parasitic bipolar phenomenon may occur when the voltage $V_{BODY}$ of the channel region 33 is 0.6 V. As shown in FIG. 6, when the hydrogen passivation time is zero, the drain voltage $V_{DS}$ is 6.5 V at $V_{BODY}$=0.6 V Also, when the hydrogen passivation time is 30, 60 and 150 minutes, the drain voltage $V_{DS}$. is 6.4 v, 6.0 V and 5.9 V, respectively, at $V_{BODY}$=0.6 V. That is, when the hydrogen passivation time is 60 minutes, the reduction of the drain voltage $V_{DS}$ at $V_{BODY}$=0.6 V is saturated. Therefore, when the hydrogen passivation time is larger than 60 minutes, a parasitic bipolar phenomenon may occur, so that the device cannot be applied to a 5 V system.

Figure 7:
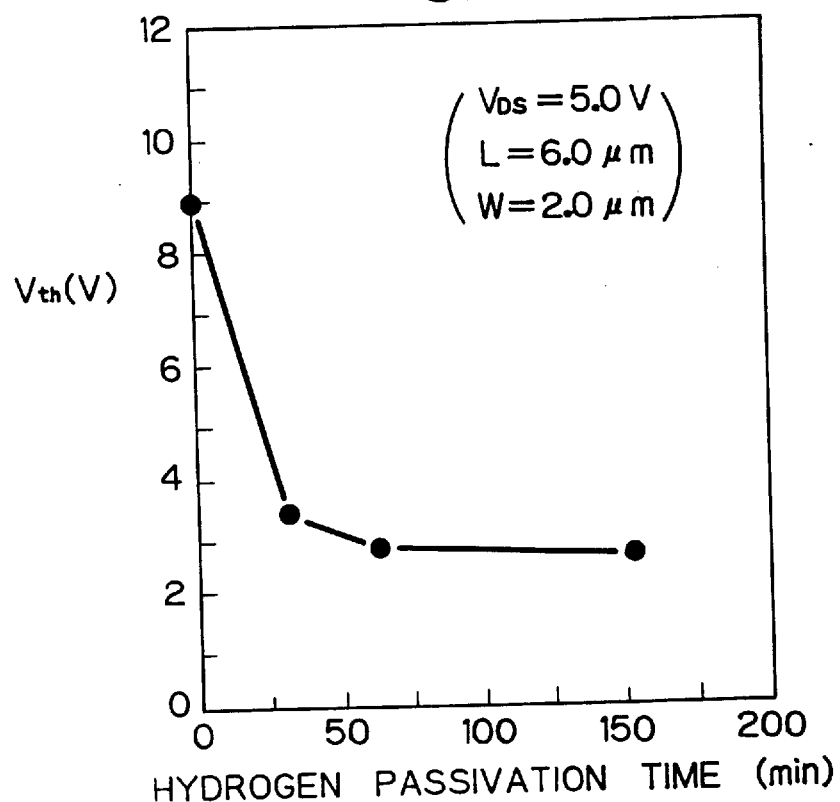
FIG. 7 is a graph showing hydrogen passivation time in relation to threshold voltage characteristics of the TFT of FIG. 4J and 5.

In FIG. 7, which shows hydrogen passivation time win relation to threshold voltage characteristics where the gate length L is 6.0 $\mu$m, the gate width W is 2.0 $\mu$m, and the drain voltage $V_{DS}$ is 5.0 V, when the hydrogen passivation time is from 0 to 30 minutes, the threshold voltage $V_{th}$ is remarkably reduced, and when the hydrogen passivation time is from 30 to 120 minutes, the threshold voltage $V_{th}$ is gradually reduced. That is, when the hydrogen passivation time is 120 minutes, the reduction of the threshold voltage $V_{th}$ is saturated.

Also, as is not shown, when the hydrogen passivation time is 30 minutes under the above-described condition, a leakage current is reduced several times ($\approx 10^{-1.5}$) (see $10^{-2}$ in the prior art) as compared with a case where no hydrogen passivation is carried out. Also, an ON current is increased some tens of hundreds of times ($\approx 10^4$) (see $10^5$ in the prior art) as compared with a case where no hydrogen passivation is carried out.

Thus, in the first embodiment, when the hydrogen passivation time is 30 minutes, the breakdown voltage is remarkably improved, although the improvement of the leakage current and the ON current are deteriorated slightly.

Figure 9A:
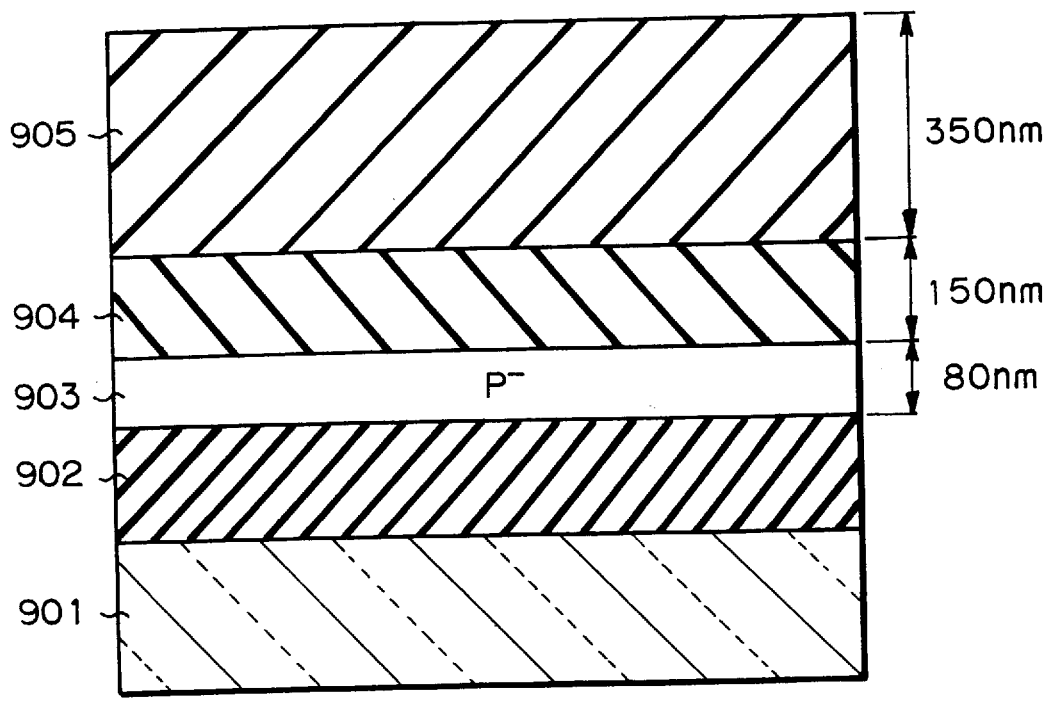
FIGS. 9A and 9B are cross-sectional views illustrating devices used for obtaining the characteristics of FIG. 8.
Figure 9B:
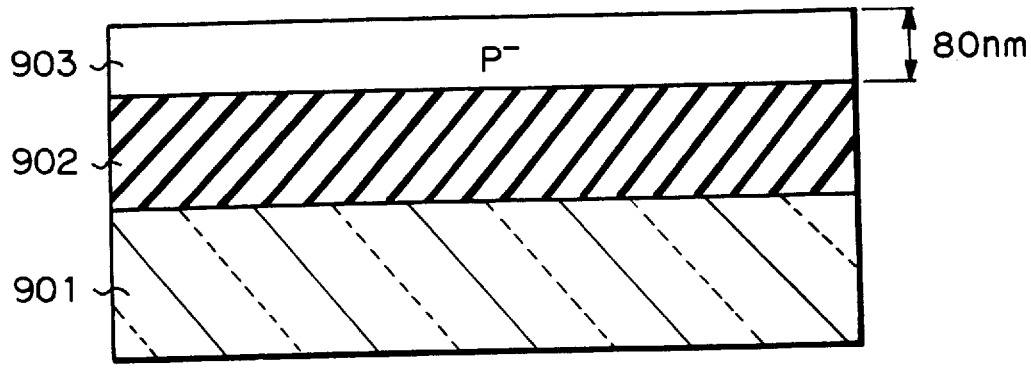

In FIG. 8, which shows hydrogen peak intensity characteristics for estimating the amount of hydrogen trapped in the polycrystalline silicon pattern 3a of FIGS. 4J and 5, devices as illustrated in FIGS. 9A and 9B are heated by a thermal desorption spectroscopy (TDS) apparatus to about 1150° C., and as a result, hydrogen degassed from the TDS apparatus is analyzed by a quadrupole mass spectrometer. Note that the device as illustrated in FIG. 9A is comprised of a fused quartz substrate 901, a non-doped silicon oxide layer 902, an about 80 $\mu$m thick $P^-$-type polycrystalline silicon layer 903, an about 150 nm thick non-doped silicon oxide layer 904 formed by an LPCVD process, and an about 350 nm thick BPSG layer 905. On the other hand, the device as illustrated in FIG. 9B is the same as the device as illustrated in FIG. 9A excluding the non-doped silicon oxide layer 904 and the BPSG layer 905.

First, after a plasma hydrogen passivation is performed upon the device as illustrated in FIG. 9A for 30, 60 and 150 minutes, the amount of hydrogen degassed from the TDS apparatus is measured as indicated by a solid line in FIG. 8. In this case, the amount of hydrogen is remarkably increased for the hydrogen passivation time of 0 to 60 minutes, and the amount of hydrogen is gradually increased for the hydrogen passivation time larger than 60 minutes.

Next, after a plasma hydrogen passivation is performed upon the device as illustrated in FIG. 9A for 30, 60 and 150 minutes, the BPSG layer 905 is removed, and thereafter, the non-doped silicon oxide layer 904 is removed by heavy hydrogen dilute fluorine acid to obtain the device of FIG. 9B. At this time, hydrogen combined with dangling bonds of silicon at the interface with the non-doped silicon oxide layer 904 is replaced by heavy hydrogen. Then, the amount of hydrogen gassed from the TDS apparatus is measured as indicated by a dot line in FIG. 8. In this case, the amount of hydrogen trapped in the polycrystalline silicon layer 903 is measured. That is, the amount of hydrogen trapped in the polycrystalline silicon layer 903 is gradually increased for the hydrogen passivation time of 0 to 30 minutes and longer than 60 minutes. On the other hand, the amount of hydrogen trapped in the polycrystalline silicon layer 903 is remarkably increased for the hydrogen passivation time between 0 to 30 minutes.

The graph as shown in FIG. 8 reveals the following phenomenon. That is, dangling bonds of most silicon of the non-doped silicon oxide layer 904 and dangling bonds of silicon of the polycrystalline silicon layer 903 at the interface with the non-doped silicon oxide layer 904 are combined with hydrogen for the first 30 minutes of the hydrogen passivation. Thereafter, dangling bonds of silicon of the polycrystalline silicon layer 903 are combined with hydrogen. In other words, hydrogen rapidly propagates in the interface of the polycrystalline silicon layer 903 with the non-doped silicon oxide layer 904, while hydrogen gradually propagates in the interior of the polycrystalline silicon layer 903.

Also, generally, the hydrogen diffusion preventing power of BPSG is low, while the hydrogen diffusion preventing power of non-doped silicon oxide and polycrystalline silicon is high.

Returning to FIG. 4J, in view of the foregoing, hydrogen at the interface of the channel region 33 with the gate silicon oxide layer 4 is diffused from the interfaces of the source region 31 and the drain region 32 with the gate silicon oxide layer 4.

Thus, in the first embodiment, the hydrogen passivation time is preferably 30 minutes; however, it depends on the thickness of the gate silicon oxide layer 4 and whether or not a BPSG layer is in direct contact with the regions 31 and 32.

Also, referring to FIGS. 6 and 8, when the hydrogen passivation time is very long, for example, longer than 60 minutes, dangling bonds of silicon of the bulk of the channel region 33 of FIG. 4J are also combined with hydrogen. As a result, minority carriers (which are in this case holes) generated in the channel region 33 are hardly recombined with electrons, so as to lengthen the life time of the minority carriers in the channel region 33, which may cause a parasitic bipolar phenomenon. As a result, the voltage $V_{BODY}$ at the channel region 33 easily rises.

As explained above, in the device of FIG. 9B, after the non-doped silicon oxide layer 904 (FIG. 9A) is removed by heavy hydrogen dilute fluoride acid, the hydrogen at the interface of the polycrystalline silicon layer 903 and the non-doped silicon oxide layer 904 is replaced by heavy hydrogen. Therefore, when the device of FIG. 4B is heated by the TDS apparatus, and heavy hydrogen degassed from the TDS apparatus is analyzed by the quadrupole mass spectrometer, the amount of degassed heavy hydrogen is changed as shown in FIG. 10. That is, the amount of degassed heavy hydrogen is at peak when the temperature of the device of FIG. 4B heated by the TDS apparatus is about 600° C. Also, most of the heavy hydrogen in the polycrystalline silicon layer 903 is degassed when the temperature of the device of FIG. 4B heated by the TDS apparatus is about 700° C. Thus, as stated above, an operation for forming a passivation layer or the like on the device of FIG. 4J is carried out preferably at a lower temperature than 500° C.

Figure 11A:
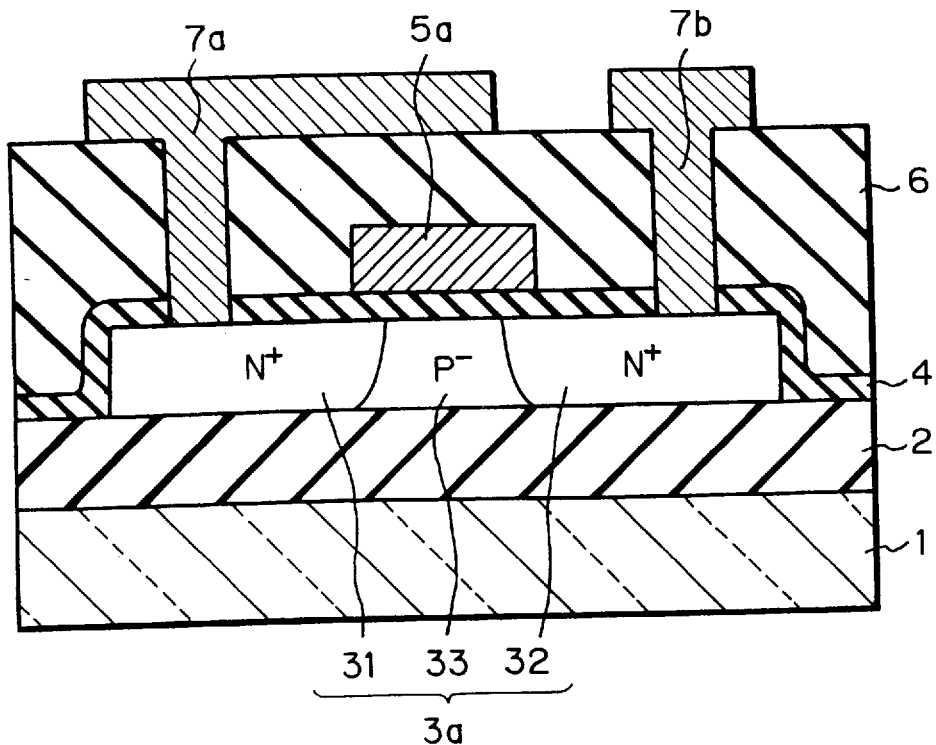
FIGS. 11A through 11B are cross-sectional views illustrating a second embodiment of the method for manufacturing a top-gate type TFT according to the present invention.
Figure 11B:
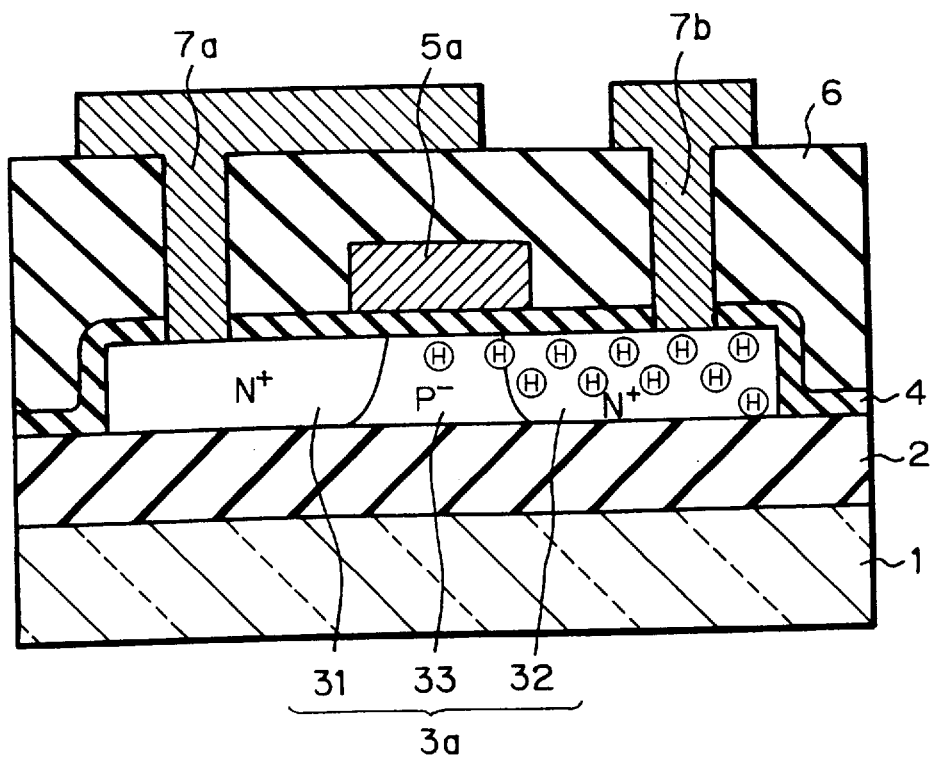
Figure 12:
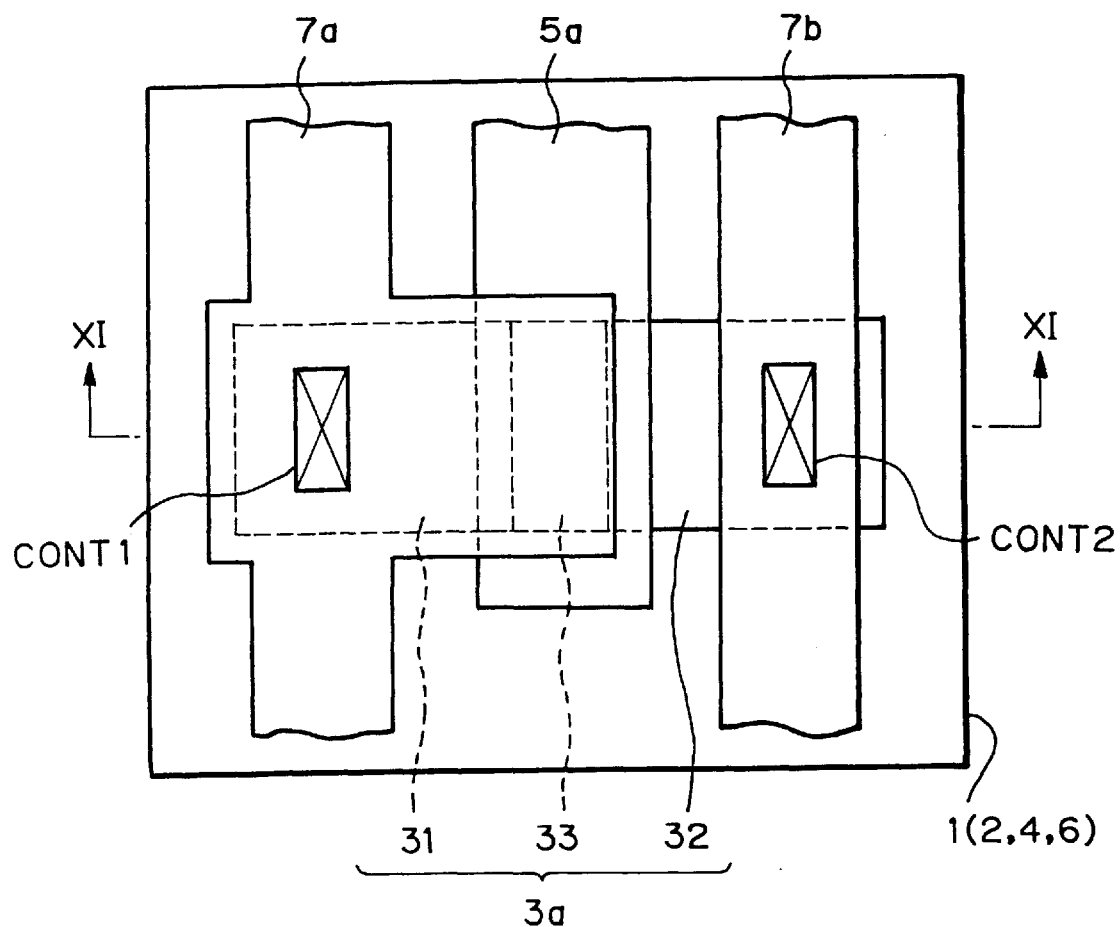
FIG. 12 is a plan view of the TFT of FIG. 11B.

FIGS. 11A and 11B are cross-sectional views illustrating a second embodiment of the method for manufacturing a top-gate type TFT according to the present invention, and FIG. 12 is a plan view of the TFT of FIG. 11B, which is a cross-sectional view taken along the line IX—IX of FIG. 12. Note that FIGS. 11A, 11B and 12 correspond to FIGS. 4I, 4J and 5, respectively. That is, the manufacturing steps as illustrated in FIGS. 4A through 4H are applied to the second embodiment.

Referring to FIG. 11A, an electrode layer 7a covers not only the source region 31 entirely but also a part of the channel region 33 (also see FIG. 12).

Finally, referring to FIG. 11B, a hydrogen passivation is carried in the same way as in FIG. 4J. In this case, since the electrode layer 7a covers the source region 31 and a part of the channel region 33, dangling bonds of silicon in the source region 31 are hardly combined with hydrogen.

Figure 13:
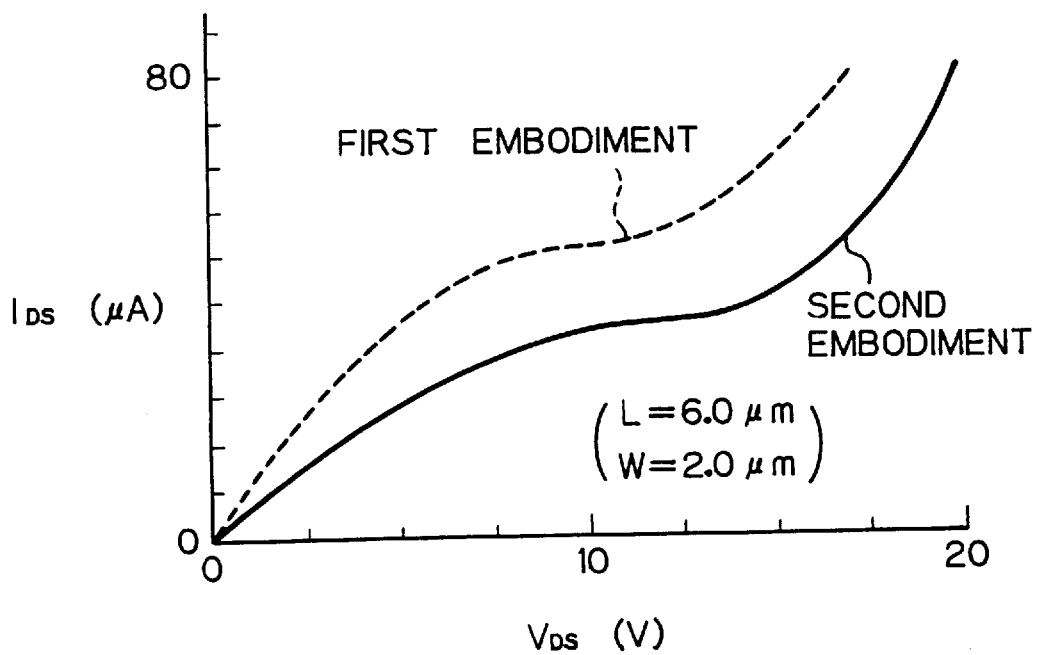
FIG. 13 is a graph showing current to voltage characteristics of the TFT of FIG. 11B and 12.

As a result, as shown in FIG. 13, the second embodiment is advantageous over the first embodiment in respect to the breakdown voltage.

Figure 14A:
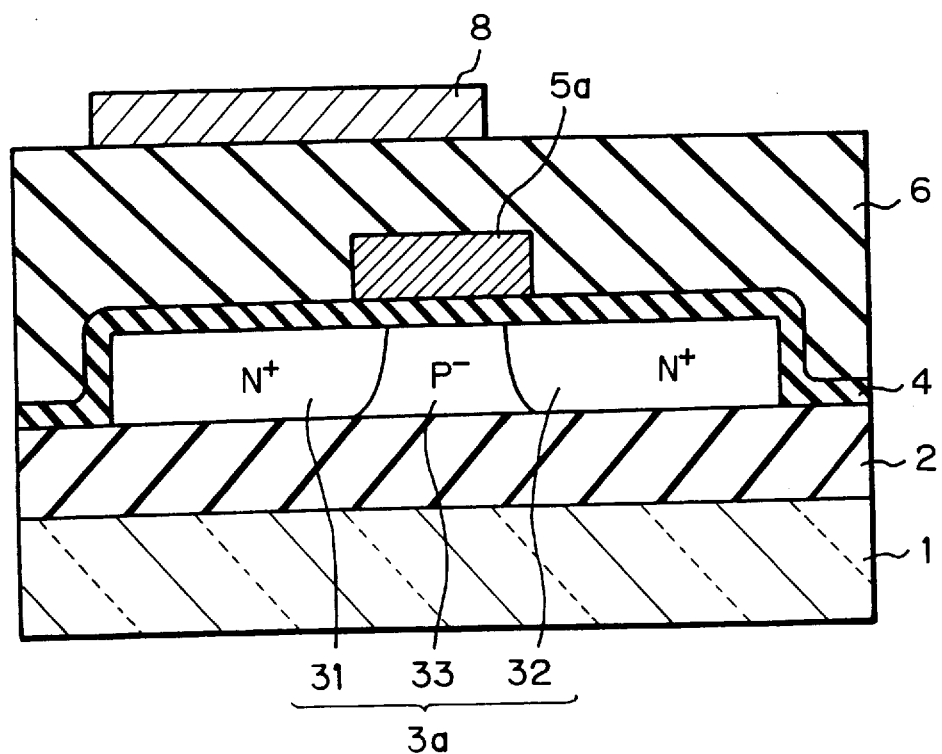
FIG. 14A through 14E are cross-sectional views illustrating a third embodiment of the method for manufacturing a top-gate type TFT according to the present invention.
Figure 14B:
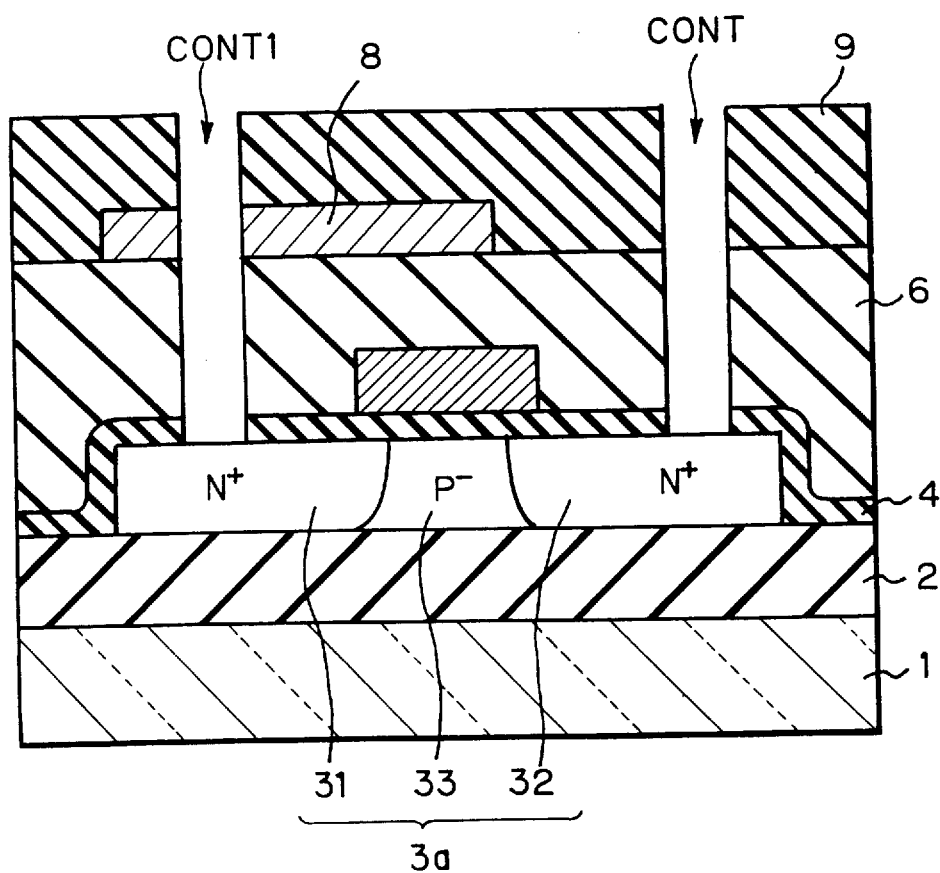
Figure 14C:
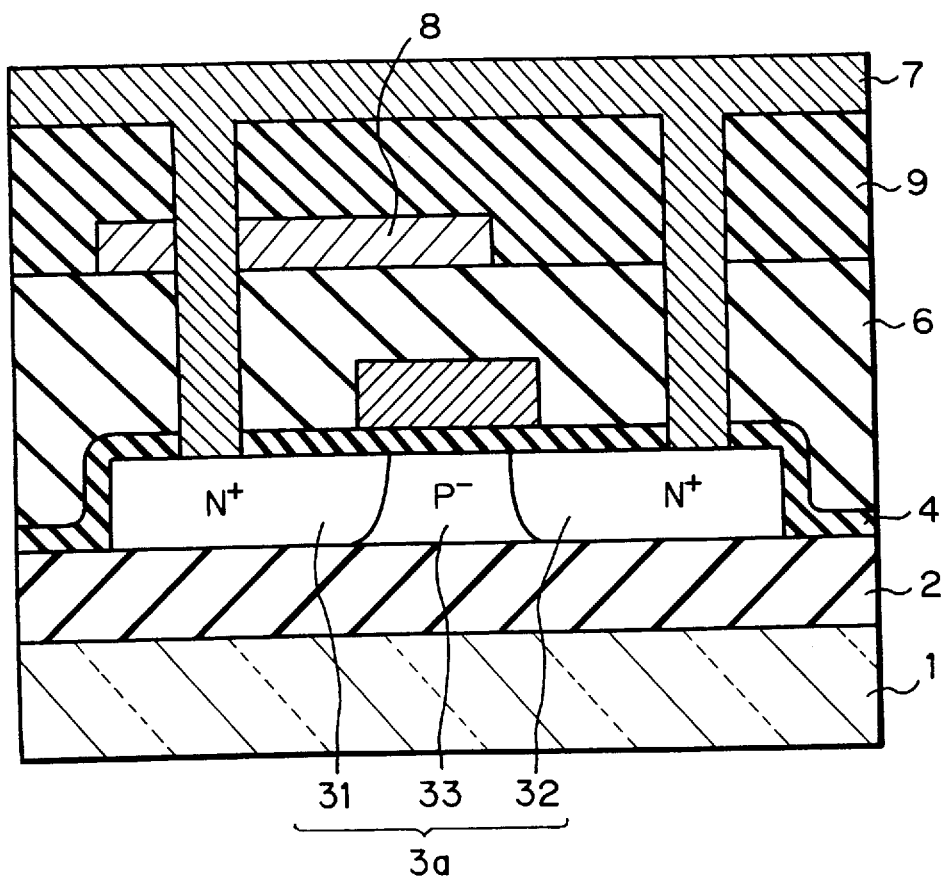
Figure 14D:
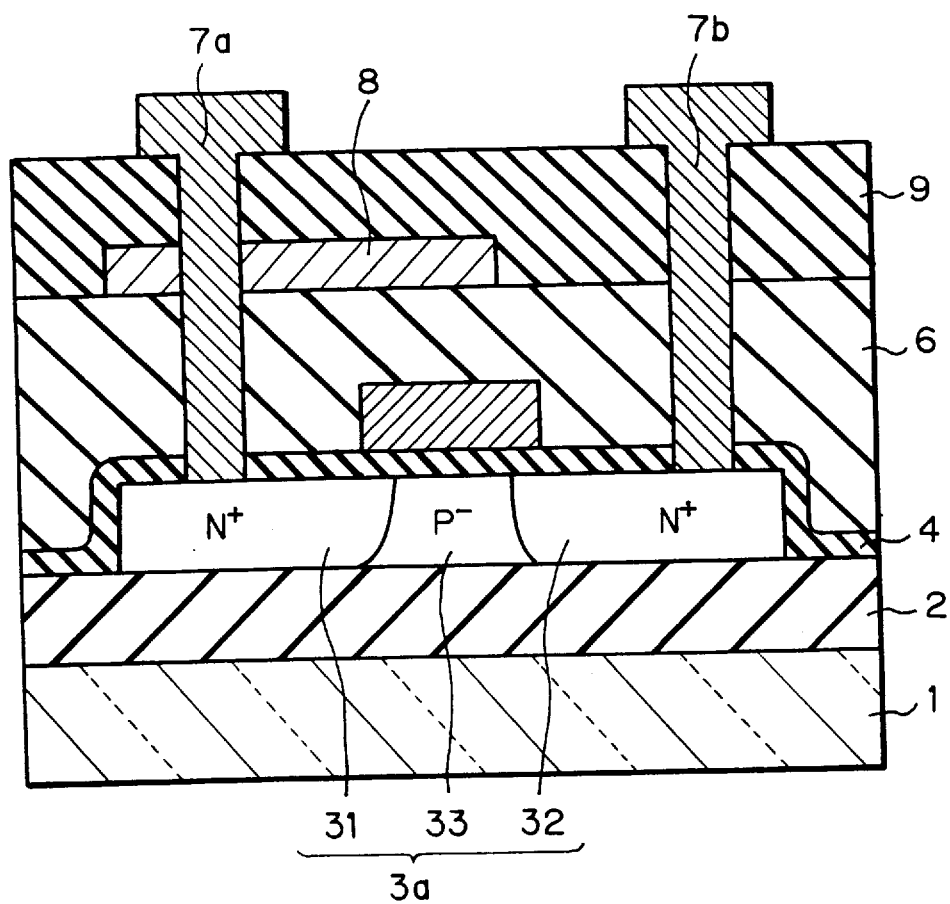
Figure 14E:
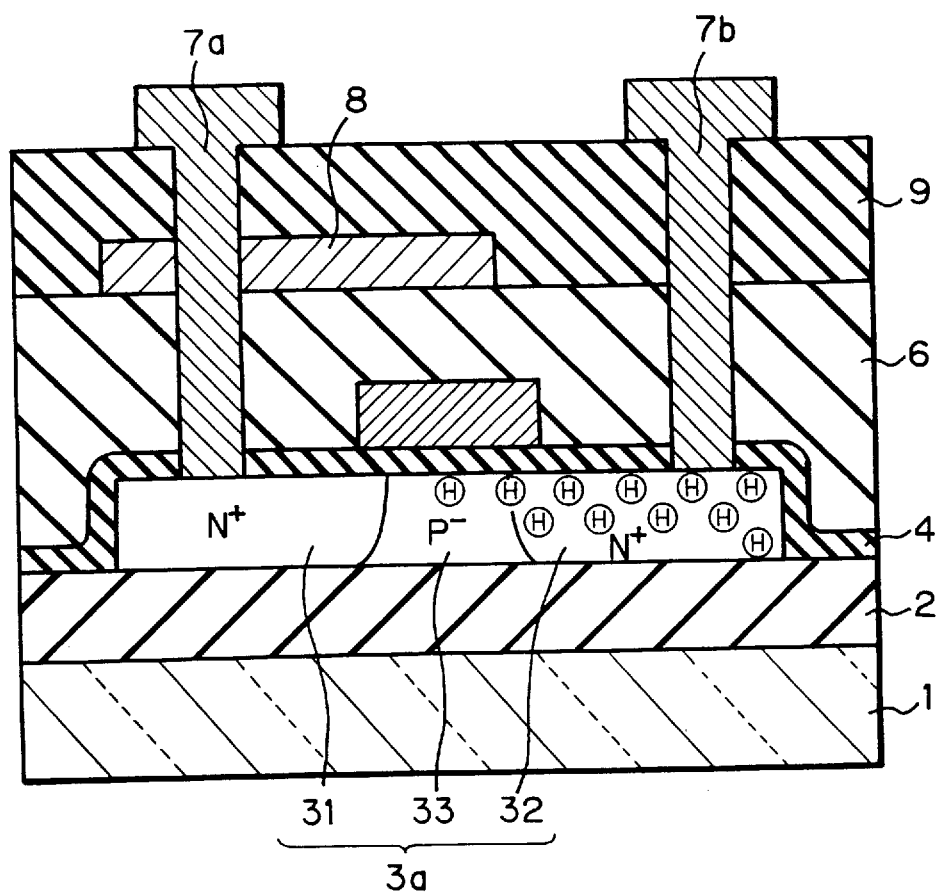
Figure 15:
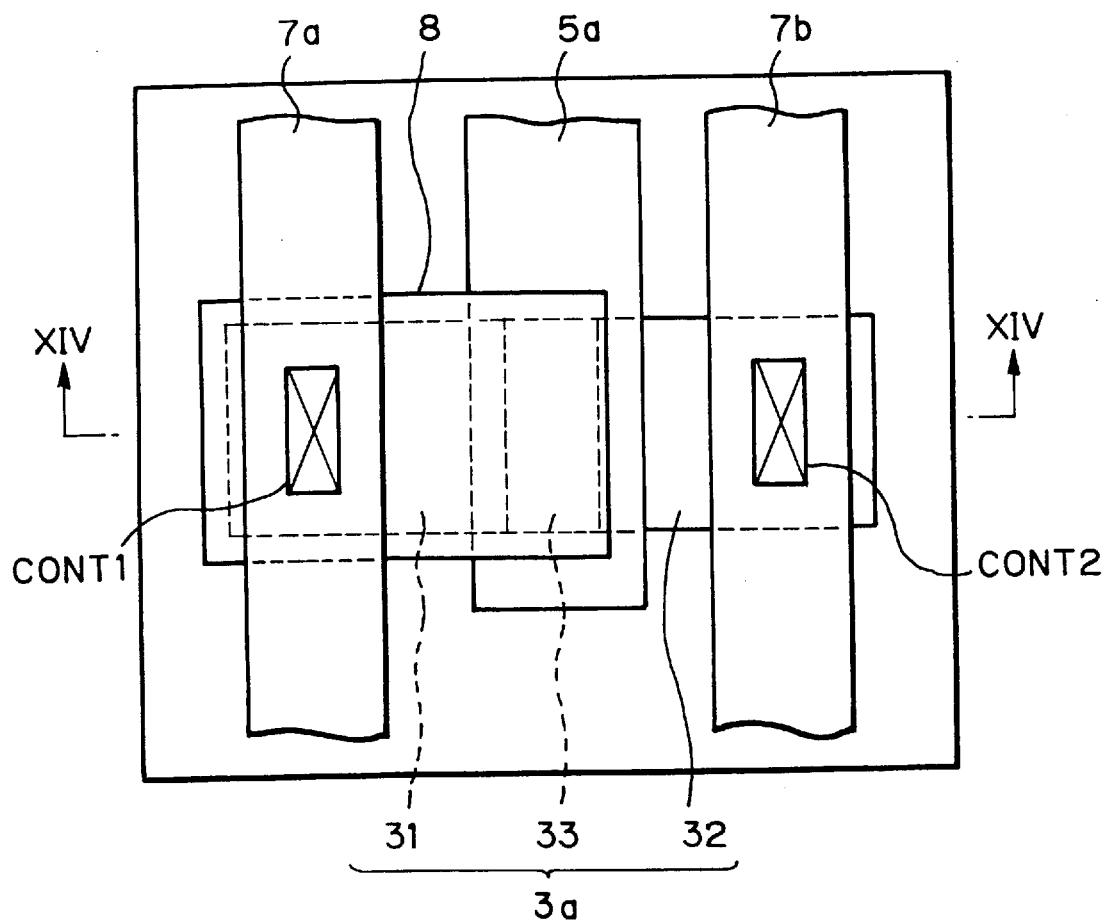
FIG. 15 is a plan view of the TFT of FIG. 14E.

FIGS. 14A through 14E are cross-sectional views illustrating a third embodiment of the method for manufacturing a top-gate type TFT according to the present invention, and FIG. 15 is a plan view of the TFT of FIG. 14F, which is a cross-sectional view taken along the line IV—IV of FIG. 15. Note that FIGS. 14A through 14E and 15 correspond to FIGS. 4G through 4J and 5, respectively. Also, the manufacturing steps as illustrated in FIGS. 4A through 4F are applied to the third embodiment.

Referring to FIG. 14A, an about 100 nm thick polycrystalline silicon layer is deposited on the insulating layer 6 by a CVD process, and is patterned. As a result, a polycrystalline silicon pattern 8 is formed to cover the source region 31 and a part of the channel region 33.

Note that a silicon nitride layer can be used instead of the polycrystalline silicon layer 8.

Next, referring to FIG. 14B, an about 300 nm thick BPSG layer 9 is deposited by an APCVD process, and a heating operation is performed upon the BPSG layer 9 to reflow it.

Further, in a similar way as that in FIG. 4G, contact holes CONT1 and CONT2 are perforated in the BPSG layer 9, the polycrystalline silicon layer 8, and the insulating layer 6 and the gate silicon oxide layer 4, so that the source region 31 and the drain region 32 are partly exposed.

Next, referring to FIG. 14C, in the same way as in FIG. 4H, an about 1 μm thick Al—Si—Cu alloy layer 7 is deposited by sputtering. Then, the device is sintered at a temperature of about 400° C. for about 20 minutes in a $H_2/N_2$ forming gas. As a result, an ohmic contact is realized between the regions 31 and 32 and the Al—Si—Cu alloy layer 7.

Next, referring to FIG. 14D, in the same way as in FIG. 4I, the Al—Si—Cu alloy layer 7 is patterned, so that electrode layers 7a and 7b are formed on the source region 31 and the drain region 32, respectively.

Finally, referring to FIG. 14E, in the same way was in FIG. 4J, a hydrogen passivation is carried out for about 30 minutes in a parallel-plate plasma reactor at a substrate temperature of about 350° C. with $H_2$—Ar gas at a power density of 0.21 W/cm² and a frequency of 30 kHz. In FIG. 4J, since the polycrystalline silicon pattern 8 covers the source region 31 and a part of the channel region 33, dangling bonds of silicon in the source region 31 are hardly combined with hydrogen.

As a result, the third embodiment is advantageous over the first embodiment in respect to the breakdown voltage.

FIGS. 16A through 16D are cross-sectional views illustrating a fourth embodiment of the method for manufacturing a top-gate type TFT according to the present invention. Also, the manufacturing steps as illustrated in FIGS. 4A through 4E are applied to the fourth embodiment.

Figure 16A:
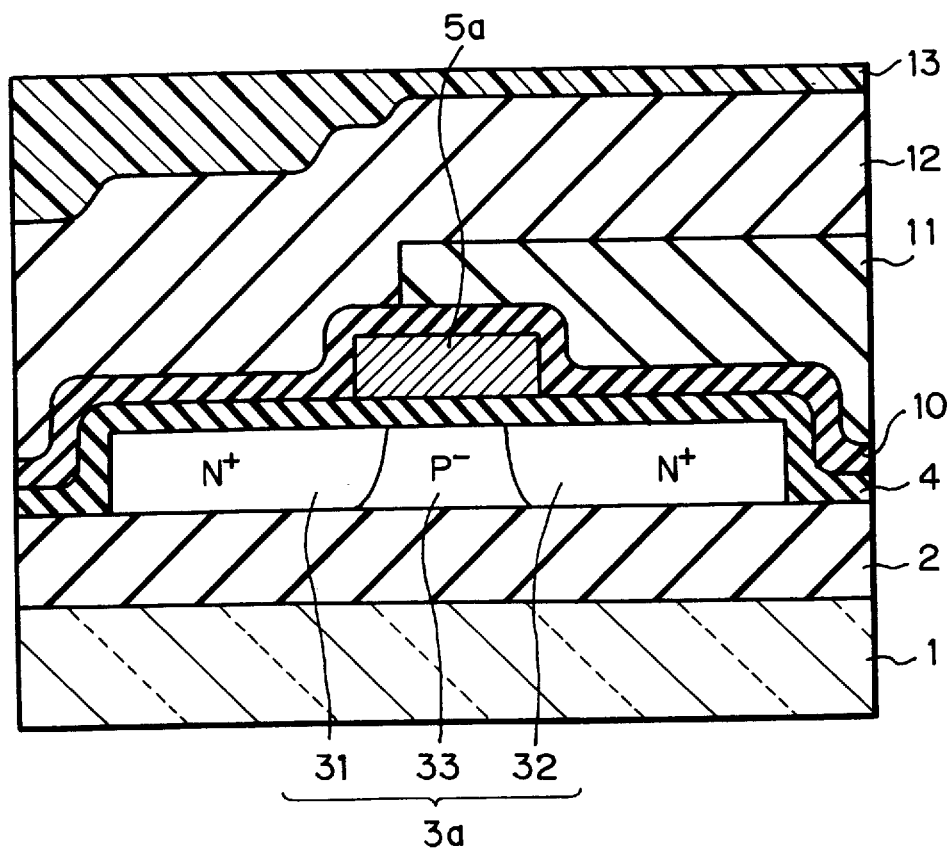
FIG. 16A through 16F are cross-sectional views illustrating a fourth embodiment of the method for manufacturing a top-gate type TFT according to the present invention.

Referring to FIG. 16A, an about 50 nm thick non-doped silicon oxide layer 10 is deposited on the entire surface by an LPCVD process.

Then, an about 350 nm thick BPSG layer is deposited by an LPCVD process and a heating operation is performed thereupon to reflow it. Then, the BPSG layer is patterned, so that a BPSG pattern 11, which covers the drain region 32 and does not cover the source region 31, is obtained.

Then, an about 500 nm thick non-doped silicon oxide layer 12 is deposited by an LPCVD process. Further, a photoresist layer 13 is coated on the silicon oxide layer 12.

Figure 16B:
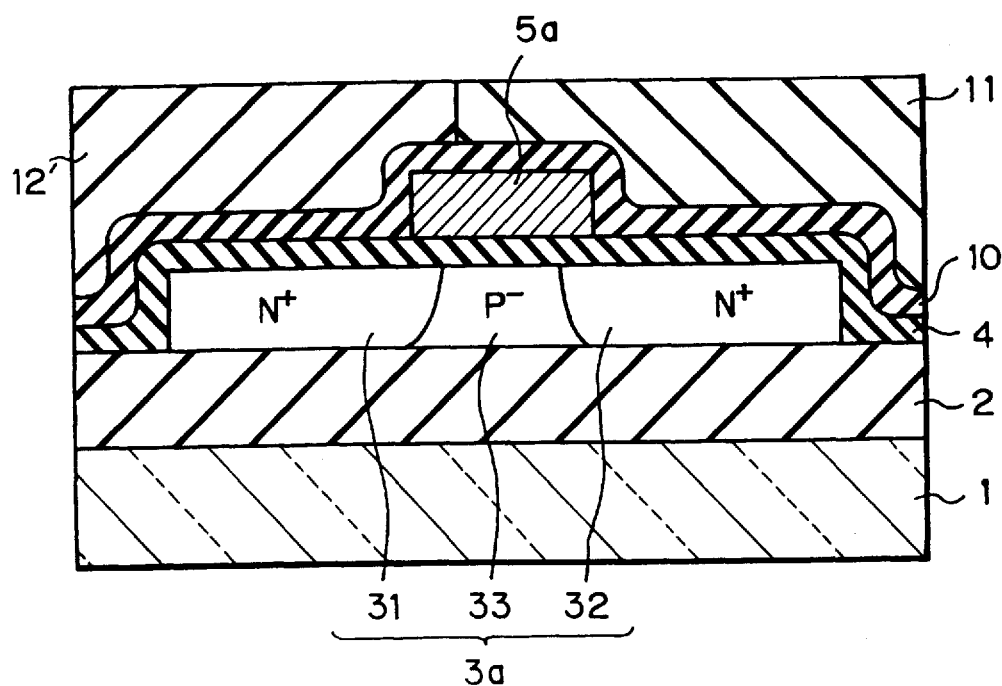

Next, referring to FIG. 16B, the photoresist layer 13 and the silicon oxide layer 12 are etched back. As a result, a silicon oxide layer 12' is left, and the height of the silicon oxide layer 12' is approximately the same as that of the BPSG layer 11.

Figure 16C:
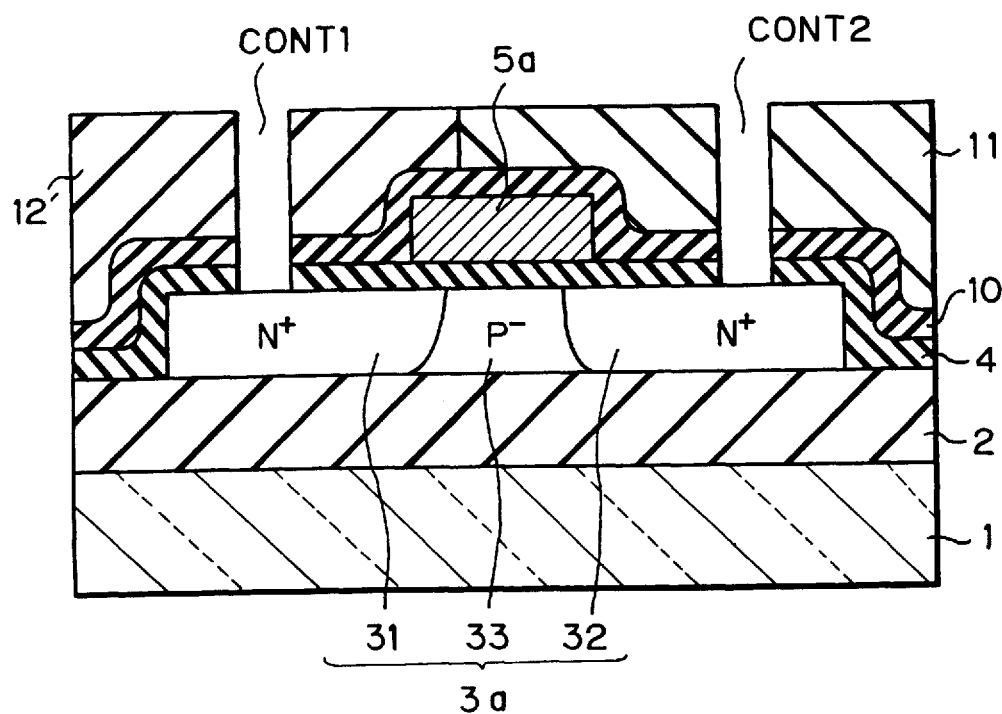

Next, referring to FIG. 16C, in a similar way as shown in FIG. 4G, a contact hole CONT1 is perforated in the silicon oxide layers 12' and 10 and the gate silicon oxide layer 4, so that the source region 31 is partly exposed. Simultaneously, a contact hole CONT2 is perforated in the BPSG layer 11, the silicon oxide layer 10 and the gate silicon oxide layer 4.

Figure 16D:
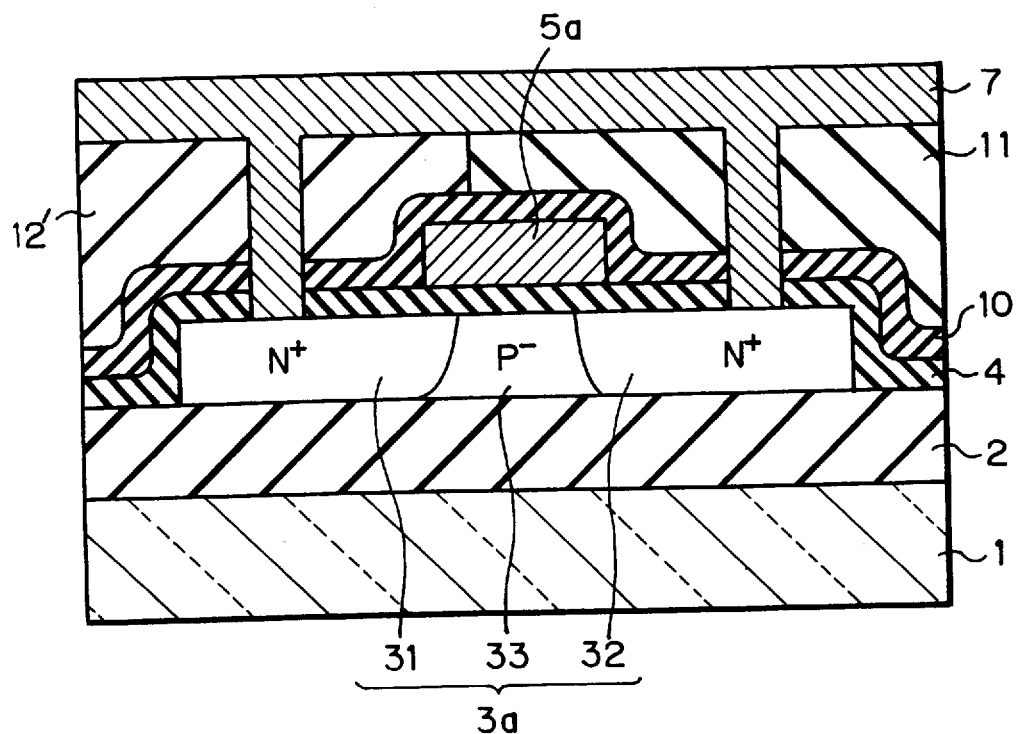

Next, referring to FIG. 16D, in the same way as in FIG. 4H, an about 1 μm thick Al—Si—Cu alloy layer 7 is deposited by sputtering. Then, the device is sintered at a temperature of about 400° C. for about 20 minutes in a $H_2/N_2$ forming gas. As a result, an ohmic contact is realized between the regions 31 and 32 and the Al—Si—Cu alloy layer 7.

Figure 16E:
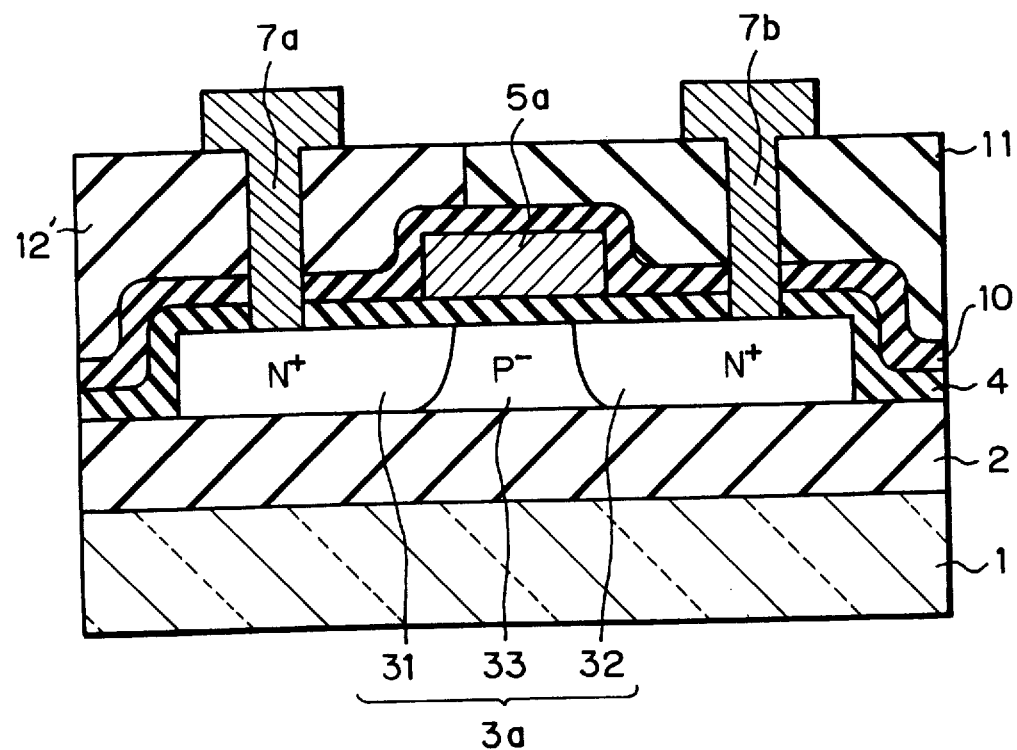

Next, referring to FIG. 16E, in the same way as in FIG. 4I, the Al—Si—Cu alloy layer 7 is patterned, so that electrode layers 7a and 7b are formed on the source region 31 and the frain region 32, respectively.

Figure 16F:
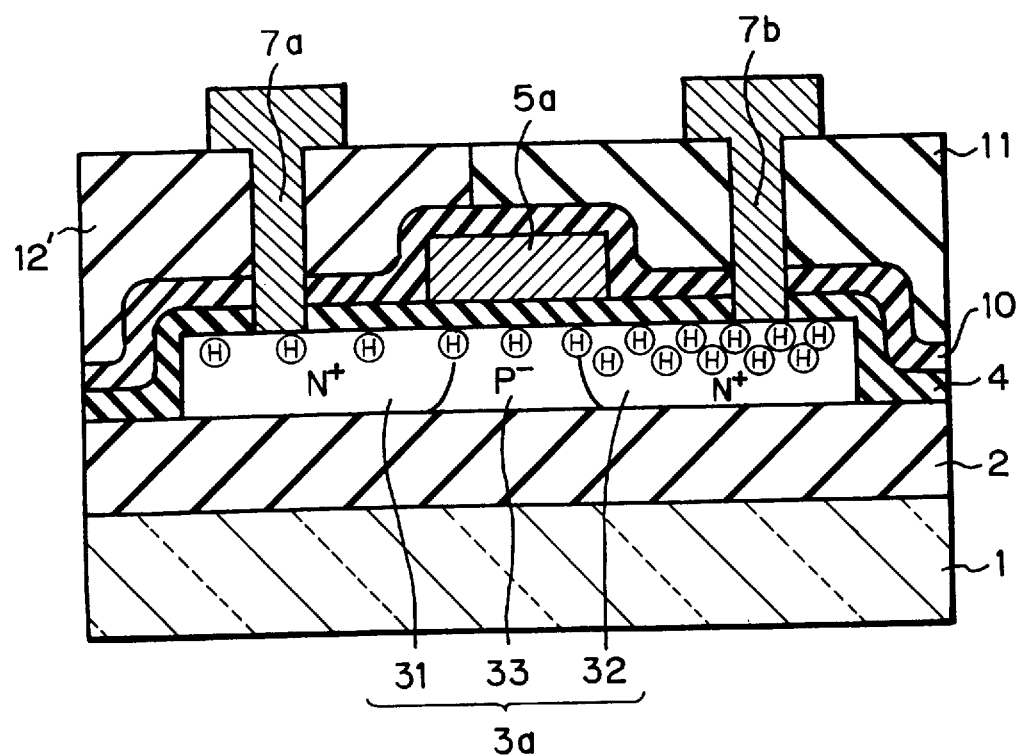

Finally, referring to FIG. 16F, in the same way as in FIG. 4J, hydrogen passivation is carried out for about 30 minutes in a parallel-plate plasma reactor at a substrate temperature of about 350° C. with $H_2$—Ar gas at a power density of 0.21 W/cm$^2$ and a frequency of 30 kHz. In FIG. 16F. Since the source region 31 is covered by only non-doped silicon oxide, dangling bonds of silicon in the source region 31 are hardly combined with hydrogen.

As a result, the fourth embodiment is advantageous over the first embodiment in respect to the breakdown voltage.

Although the above-described embodiments relate to an N-channel type top-gate type TFT, the present invention can be also applied to a P-channel type top-gate type TFT.

Also, in the above-described embodiments, an insulating substrate made of non-doped monocrystalline silicon can be used instead of the fused quartz substrate 1 and the silicon oxide layer 2.

As explained hereinbefore, according to the present invention, in a channel region of a top-gate type TFT, since only dangling bonds of silicon of a channel region at an interface with a gate insulating layer are combined with hydrogen, a bipolar parasitic phenomenon hardly occurs therein. As a result, the reduction of the breakdown voltage and the fluctuation of the threshold voltage can be suppressed.

I claim:

1. A method for manufacturing a top-gate type thin film transistor, comprising:

forming a polycrystalline silicon layer on a substrate;

forming a gate insulating layer on said polycrystalline silicon layer;

forming a gate electrode on said gate insulating layer;

introducing impurity ions into said polycrystalline silicon layer in self-alignment with said gate electrode to create source and drain regions in said polystalline silicon Layer, a channel region of said polycrystalline silicon layer being sandwiched by said source and drain regions thereof;

forming an insulating layer on said gate electrode and over said polycrystalline silicon layer;

perforating first and second contact holes in said insulating layer and said gate insulating layer, said first and second contact holes reaching said source and drain regions, respectively;

forming first and second metal electrodes in said first and second contact holes, respectively, said first and second metal electrodes being coupled to said source and drain regions, respectively, said first metal electrode covering said source region and a part of said channel region, said second metal electrode covering only a part of said drain region; and performing hydrogen passivation upon said polycrystalline silicon layer after said first and second metal electrodes are formed, so that dangling bonds of silicon of said channel region at an interface with said gate insulating layer and dangling bonds of silicon of a part of said drain region are combined with hydrogen.

2. A method as set forth in claim 1, wherein said insulating layer is made of a double configuration of non-doped silicon oxide and BPSG.

3. A method as set forth in claim 1, wherein said hydrogen passivation step carries out said hydrogen passivation using hydrogenation by plasma discharge.

4. A method as set forth in claim 3, wherein said hydrogen passivation step carries out said hydrogen passivation for a time period less than approximately 30 minutes.

5. A method as set forth in claim 1, further comprising a step of heating said device at a temperature lower than approximately 500° C. for degassing hydrogen from said polycrystalline silicon layer, after said hydrogen passivation is carried out.

6. A method for manufacturing a top-gate type thin film transistor, comprising:

forming a polycrystalline silicon layer on a substrate;

forming a gate insulating layer on said polycrystalline silicon layer;

forming a gate electrode on said gateinsulating layer;

introducing impurity ions into said polycrystalline silicon layer in self-alignment with said gate electrode to create source and drain regions in said polycrystalline silicon layer, a channel region of said polycrystalline silicon layer being sandwiched by said source and drain regions thereof;

forming an insulating layer on said gate electrode and over said polycrystalline silicon layer;

perforating first and second contact holes in said insulating layer and said gate insulating layer, said first and second contact holes reaching said source and drain regions, respectively;

forming first and second metal electrodes in said first and second contact holes, respectively, said first and second metal electrodes being coupled to said source and drain regions, respectively; and performing hydrogen passivation upon said polycrystalline silicon layer after said first and second metal electrodes are formed, so that dangling bonds of silicon of said channel region at an interface with said gate insulating layer and dangling bonds of silicon of a part of said source and drain regions are combined with hydrogen;

further comprising a step of heating said device at a temperature lower than approximately 500° C. for degassing hydrogen from said polycrystalline silicon layer, after said hydrogen passivation is carried out.

7. A method for manufacturing a top-gate type thin film transistor, comprising:

forming a polycrystalline silicon layer on a substrate;

forming a gate insulating layer on said polycrystalline silicon layer;

forming a gate electrode on said gate insulating layer;

introducing impurity ions into said polycrystalline silicon layer in self-alignment with said gate electrode to create source and drain regions in said polystalline silicon layer, a channel region of said polycrystalline silicon layer being sandwiched by said source and drain regions thereof;

forming a first insulating layer on said gate electrode and over said polycrystalline silicon layer;

forming a hydrogen diffusion preventing layer on said first insulating layer, said hydrogen diffusion preventing layer covering said source region and a part of said channel region;

forming a second insulating layer on said hydrogen diffusion preventing layer and said first insulating layer;

perforating a first contact hole in said second insulating layer, said hydrogen diffusion preventing layer, said first insulating layer and said gate insulating layer, said first contact hole reaching said source region;

perforating a second contact hole in said second and first insulating layers and said gate insulating layer, said second contact hole reaching said drain region;

forming first and second metal electrodes in said first and second contact holes, respectively, said first and second metal electrodes being coupled to said source and drain regions, respectively; and performing hydrogen passivation upon said polycrystalline silicon layer after said first and second metal electrodes are formed, so that dangling bonds of silicon of said channel region at an interface with said gate insulating layer and dangling bonds of silicon of a part of said drain region are combined with hydrogen.

8. A method as set forth in claim 7, wherein said hydrogen diffusion preventing layer is made of polycrystalline silicon.

9. A method as set forth in claim 7, wherein said hydrogen diffusion preventing layer is made of silicon nitride.

10. A method as set forth in claim 7, wherein said first metal electrode covers only a part of said source region and said second metal electrode covers only a part of said drain region.

11. A method as set forth in claim 7, wherein said first insulating layer is made of a double configuration of non-doped silicon oxide and BPSG.

12. A method as set forth in claim 7, wherein said second insulating layer is made of BPSG.

13. A method as set forth in claim 7, wherein said hydrogen passivation step carries out said hydrogen passivation using hydrogenation by plasma discharge.

14. A method as set forth in claim 13, wherein said hydrogen passivation step carries out said hydrogen passivation for a time period less than approximately 30 minutes.

15. A method as set forth in claim 7, further comprising a step of heating said device at a temperature lower than approximately 500° C. for degassing hydrogen from said polycrystalline silicon layer, after said hydrogen passivation is carried out.

16. A method for manufacturing a top-gate type thin film transistor, comprising:

forming a polycrystalline silicon layer on a substrate;

forming a gate insulating layer on said polycrystalline silicon layer;

forming a gate electrode on said gate insulating layer;

introducing impurity ions into said polycrystalline silicon layer in self-alignment with said gate electrode to create source and drain regions in said polystalline silicon layer, a channel region of said polycrystalline silicon layer being sandwiched by said source and drain regions thereof;

forming a first non-doped silicon oxide layer on said gate electrode and over said polycrystalline silicon layer;

forming an impurity-doped silicon oxide layer on said first non-doped silicon oxide layer and over said drain region and a part of said channel region;

forming a second non-doped silicon oxide layer on said first non-doped silicon oxide layer and over said source region and the other part of said channel region;

perforating a first contact hole in said second and first non-doped silicon oxide layers and said gate insulating layer, said first contact hole reaching said source region;

perforating a second contact hole in said impurity-doped silicon oxide layer, said first non-doped silicon oxide layer and said gate insulating layer, said second contact hole reaching said drain region;

forming first and second metal electrodes in said first and second contact holes, respectively, said first and second metal electrodes being coupled to said source and drain regions, respectively; and performing hydrogen passivation upon said polycrystalline silicon layer after said first and second metal electrodes are formed, so that dangling bonds of silicon of said channel region at an interface with said gate insulating layer and dangling bonds of silicon of a part of said source and drain regions are combined with hydrogen.

17. A method as set forth in claim 16, wherein said first metal electrode covers only a part of said source region and said second metal electrode covers only a part of said drain region.

18. A method as set forth in claim 16, wherein said hydrogen passivation step carries out said hydrogen passivation using hydrogenation by plasma discharge.

19. A method as set forth in claim 18, wherein said hydrogen passivation step carries out said hydrogen passivation for a time period less than approximately 30 minutes.

20. A method as set forth in claim 16, further comprising a step of heating said device at a temperature lower than approximately 500° C. for degassing hydrogen from said polycrystalline silicon layer, after said hydrogen passivation is carried out.

* * * * *